(12) United States Patent
Costa et al.

(10) Patent No.: US 10,405,433 B2
(45) Date of Patent: Sep. 3, 2019

(54) METHOD FOR MANUFACTURING AN INTEGRATED CIRCUIT PACKAGE

(71) Applicant: Qorvo US, Inc., Greensboro, NC (US)

(72) Inventors: Julio C. Costa, Oak Ridge, NC (US); George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/945,418

(22) Filed: Apr. 4, 2018

(65) Prior Publication Data

US 2018/0228030 A1    Aug. 9, 2018

Related U.S. Application Data

(62) Division of application No. 14/872,910, filed on Oct. 1, 2015, now Pat. No. 10,085,352.

(Continued)

(51) Int. Cl.
*H05K 1/18* (2006.01)
*H05K 3/28* (2006.01)
(Continued)

(52) U.S. Cl.
CPC ......... *H05K 3/284* (2013.01); *H01F 17/0013* (2013.01); *H01F 27/24* (2013.01);
(Continued)

(58) Field of Classification Search
CPC . H01L 23/3121; H01L 23/36; H01L 23/3737; H01L 23/49822; H05K 3/284; H01F 27/24
(Continued)

(56) References Cited

U.S. PATENT DOCUMENTS 4,093,562 A    6/1978   Kishimoto
4,366,202 A   12/1982   Borovsky
(Continued)

FOREIGN PATENT DOCUMENTS

CN    103811474 A    5/2014
CN    103872012 A    6/2014
(Continued)

OTHER PUBLICATIONS

Non-Final Office Action for U.S. Appl. No. 15/676,693, dated May 3, 2018, 14 pages.
(Continued)

*Primary Examiner* — Dao H Nguyen
(74) *Attorney, Agent, or Firm* — Withrow & Terranova, P.L.L.C.

(57) ABSTRACT

This disclosure relates to integrated circuit (IC) packages and methods of manufacturing the same. In one method, a printed circuit board is provided with semiconductor die. The semiconductor die includes a Back-End-of-Line (BEOL) region, a Front-End-of-Line (FEOL) region, and a semiconductor handle such that the BEOL region, the FEOL region, and the semiconductor handle are stacked. A first polymer layer is provided over the printed circuit board so as to cover the semiconductor die. The semiconductor handle of the semiconductor die is exposed through the first polymer layer and removed. A second polymer layer is then provided so that the BEOL region, the FEOL region, and at least a portion of the second polymer layer are stacked. The second polymer layer may be provided to have high thermal conductivity and electric isolation properties thereby providing advantageous package characteristics.

17 Claims, 29 Drawing Sheets

Related U.S. Application Data

(60) Provisional application No. 62/074,429, filed on Nov. 3, 2014, provisional application No. 62/058,368, filed on Oct. 1, 2014.

(51) Int. Cl.

| | |
|---|---|
| *H05K 3/46* | (2006.01) |
| *H01F 17/00* | (2006.01) |
| *H01F 27/24* | (2006.01) |
| *H01L 23/00* | (2006.01) |
| *H01L 23/31* | (2006.01) |
| *H01L 23/36* | (2006.01) |
| *H01L 23/64* | (2006.01) |
| *H01L 23/373* | (2006.01) |
| *H01L 23/498* | (2006.01) |
| *H01L 25/065* | (2006.01) |

(52) U.S. Cl.
CPC ...... *H01L 23/3121* (2013.01); *H01L 23/3135* (2013.01); *H01L 23/36* (2013.01); *H01L 23/3737* (2013.01); *H01L 23/49822* (2013.01); *H01L 23/645* (2013.01); *H01L 25/0655* (2013.01); *H01F 2017/0086* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/131* (2013.01); *H01L 2224/13147* (2013.01); *H01L 2224/16227* (2013.01); *H01L 2224/32225* (2013.01); *H01L 2224/73204* (2013.01); *H01L 2224/81815* (2013.01); *H01L 2224/92125* (2013.01); *H01L 2224/97* (2013.01); *H01L 2924/15313* (2013.01); *H01L 2924/18161* (2013.01); *H01L 2924/19042* (2013.01); *H01L 2924/19105* (2013.01); *H01L 2924/3511* (2013.01); *H05K 1/183* (2013.01); *H05K 3/4697* (2013.01); *H05K 2201/086* (2013.01); *H05K 2201/1003* (2013.01)

(58) Field of Classification Search
USPC ............... 257/712, 758, 774, 690, 415, 260, 257/E21.499, E21.502, E21.503, E21.652, 257/E21.655, 21.658, E23.011, E23.054, 257/E23.055, E23.124, E29.022, E29.034; 438/458, 243, 127, 113, 108, 51
See application file for complete search history.

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,729,075 A | 3/1998 | Strain | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,423,570 B1 | 7/2002 | Ma et al. | |
| 6,426,559 B1 | 7/2002 | Bryan et al. | |
| 6,446,316 B1 | 9/2002 | Furbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B2 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,279,750 B2 | 10/2007 | Jobetto | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,489,032 B2 | 2/2009 | Jobetto | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,843,072 B1 | 11/2010 | Park et al. | |
| 7,855,101 B2 | 12/2010 | Furman et al. | |
| 7,868,419 B1 | 1/2011 | Kerr et al. | |
| 7,910,405 B2 | 3/2011 | Okada et al. | |
| 7,960,218 B2 | 6/2011 | Ma et al. | |
| 8,004,089 B2 | 8/2011 | Jobetto | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,816,407 B2 * | 8/2014 | Kim ..................... H01L 23/481 257/260 |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 8,983,399 B2 | 3/2015 | Kawamura et al. | |
| 9,165,793 B1 | 10/2015 | Wang et al. | |
| 9,214,337 B2 | 12/2015 | Carroll et al. | |
| 9,349,700 B2 | 5/2016 | Hsieh et al. | |
| 9,368,429 B2 | 6/2016 | Ma et al. | |
| 9,461,001 B1 | 10/2016 | Tsai et al. | |
| 9,520,428 B2 | 12/2016 | Fujimori | |
| 9,530,709 B2 | 12/2016 | Leipold et al. | |
| 9,613,831 B2 | 4/2017 | Morris et al. | |
| 9,646,856 B2 | 5/2017 | Meyer et al. | |
| 9,786,586 B1 | 10/2017 | Shih | |
| 9,812,350 B2 | 11/2017 | Costa | |
| 9,824,951 B2 | 11/2017 | Leipold et al. | |
| 9,824,974 B2 | 11/2017 | Gao et al. | |
| 9,859,254 B1 | 1/2018 | Yu et al. | |
| 9,875,971 B2 | 1/2018 | Bhushan et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 * | 9/2002 | Ma ..................... H01L 21/561 438/127 |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |

(56) References Cited

U.S. PATENT DOCUMENTS

| | | |
|---|---|---|
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0127340 A1* | 5/2010 | Sugizaki ............... B81B 7/007 257/415 |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1* | 9/2015 | Meyer ................ H01L 23/3107 257/737 |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0032957 A1 | 2/2017 | Costa et al. |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0207350 A1 | 7/2017 | Leipold et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |

FOREIGN PATENT DOCUMENTS

| | | |
|---|---|---|
| EP | 2996143 A1 | 3/2016 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.

(56) References Cited

OTHER PUBLICATIONS

Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Hienawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.

(56) References Cited

OTHER PUBLICATIONS

Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

(56) References Cited

OTHER PUBLICATIONS

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H.S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of Fcmbga with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Notice of Allowance for U.S. Appl. No. 15/676,693, dated Jul. 20, 2018, 8 pages.
Corrected Notice of Allowance for U.S. Appl. No. 15/676,693, dated Aug. 29, 2018, 5 pages.
Notice of Allowance for U.S. Appl. No. 15/695,629, dated Jul. 11, 2018, 12 pages.
Notice of Allowance for U.S. Appl. No. 15/914,538, dated Aug. 1, 2018, 9 pages.
First Office Action for Chinese Patent Application No. 201510746323.X, dated Nov. 2, 2018, 12 pages.
Final Office Action for U.S. Appl. No. 15/601,858, dated Nov. 26, 2018, 16 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
Non-Final Office Action for U.S. Appl. No. 15/695,579, dated Jan. 28, 2019, 8 pages.
Notice of Allowance for U.S. Appl. No. 15/695,579, dated Mar. 20, 2019, 8 pages.
Non-Final Office Action for U.S. Appl. No. 15/992,613, dated Feb. 27, 2019, 15 pages.
International Preliminary Report on Patentability for PCT/US20171046744, dated Feb. 21, 2019, 11 pages.
International Preliminary Report on Patentability for PCT/US20171046758, dated Feb. 21, 2019, 11 pages.
International Preliminary Report on Patentability for PCT/US20171046779, dated Feb. 21, 2019, 11 pages.
Non-Final Office Action for U.S. Appl. No. 15/601,858, dated Apr. 17, 2019, 9 pages.
Notice of Allowance for U.S. Appl. No. 16/004,961, dated May 13, 2019, 8 pages.
Notice of Allowance for U.S. Appl. No. 15/992,639, dated May 9, 2019, 7 pages.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.

* cited by examiner

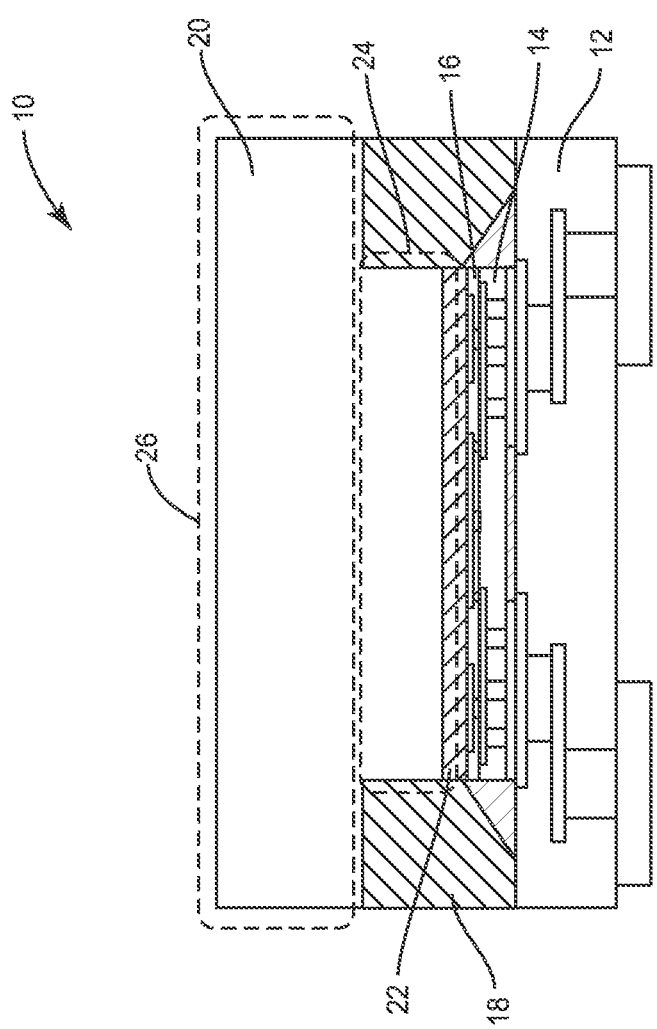

Cool Polymers®
CoolPoly® D5506 THERMALLY CONDUCTIVE LIQUID CRYSTALLINE POLYMER (LCP)
CoolPoly D series of thermally conductive plastics transfers heat, a characteristic previously unavailable in injection molding grade polymers. CoolPoly is lightweight, netshape moldable and allows design freedom in applications previously restricted to metals. The D series is electrically non-conductive and can be used for its dielectric properties.

| THERMAL | SI/METRIC |
|---|---|
| THERMAL CONDUCTIVITY | 10 W/mK |
| THERMAL DIFFUSIVITY | 0.05 cm$^2$/sec |
| SPECIFIC HEAT | 1.0 J/g°C |
| COEFFICIENT OF LINEAR THERMAL EXPANSION | |
|     PARALLEL | 6.2 ppm/°C |
|     NORMAL | 5.6 ppm/°C |
| TEMPERATURE OF DEFLECTION | |
|     @ 0.45 MPa | >300 °C |
|     @ 1.80 MPa | 263 °C |
| FLAMMABILITY | V0 @ 1.0 mm |
| MECHANICAL | SI/METRIC |
| TENSILE MODULUS | 10900 MPa |
| TENSILE STRENGTH | 50 MPa |
| NOMINAL STRAIN @ BREAK | 0.7 % |
| FLEXURAL STRENGTH | 84 MPa |
| FLEXURAL MODULUS | 12300 MPa |
| IMPACT STRENGTH | |
|     CHARPY UNNOTCHED | 6.0 kJ/m$^2$ |
|     CHARPY NOTCHED | 3.2 kJ/m$^2$ |
| ELECTRICAL | SI/METRIC |
| SURFACE RESISTIVITY | 2.0E14 OHM/SQUARE |
| VOLUME RESISTIVITY | 1.6E14 OHM-CM |
| PHYSICAL | SI/METRIC |
| DENSITY | 1.80 g/cc |
| MOLD SHRINKAGE | |
|     FLOW | 0.1 % |
|     CROSS-FLOW | 0.3 % |

*FIG. 1A*

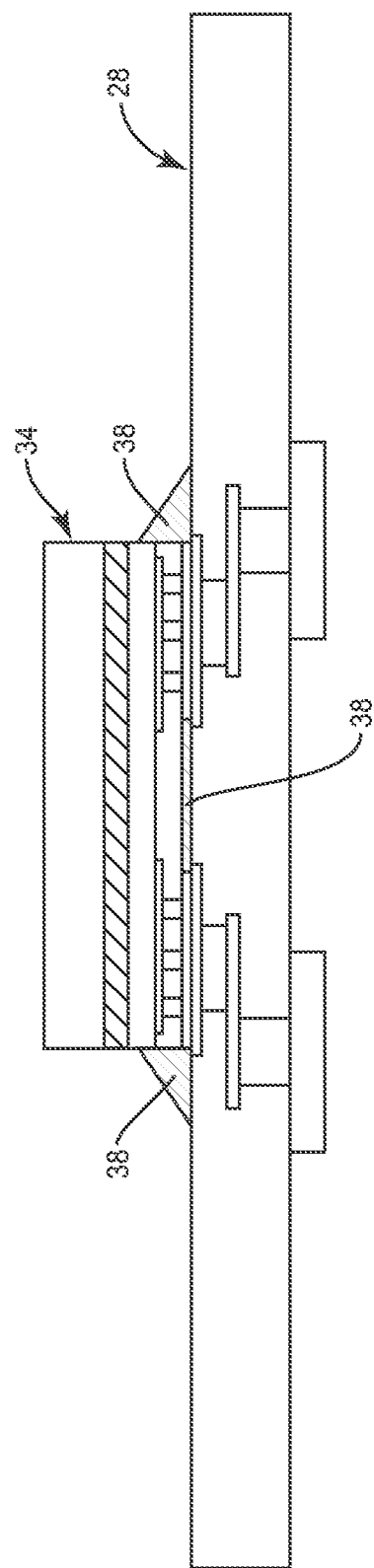

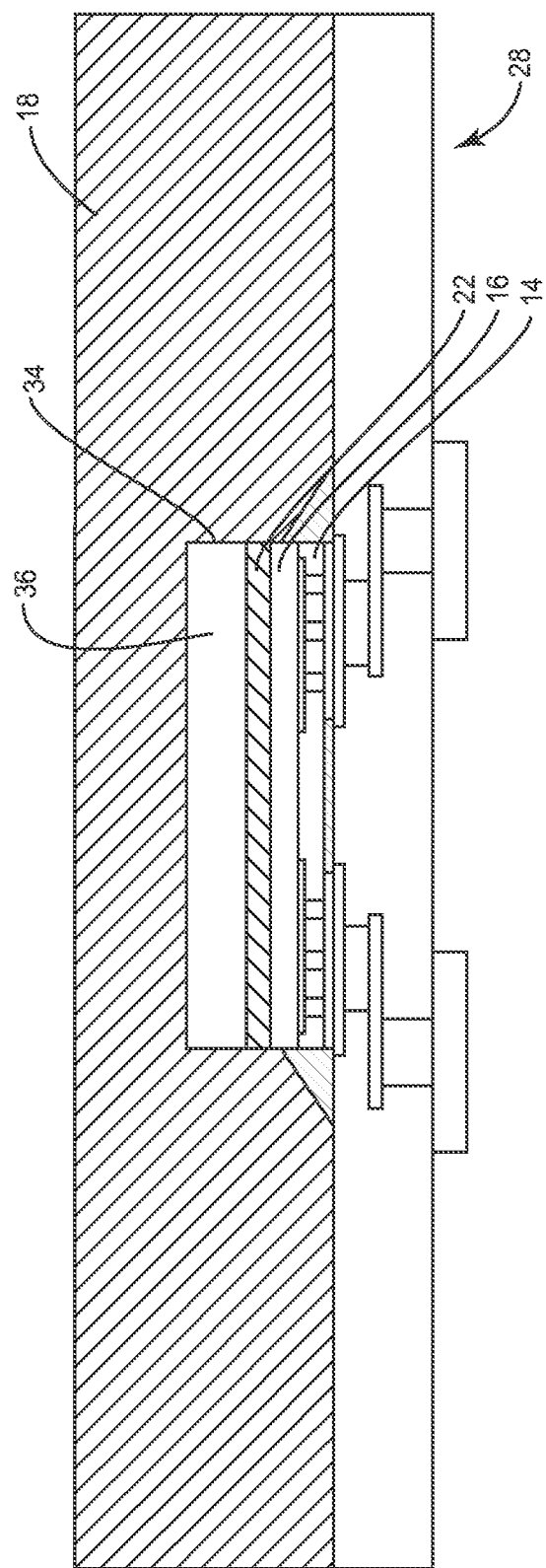

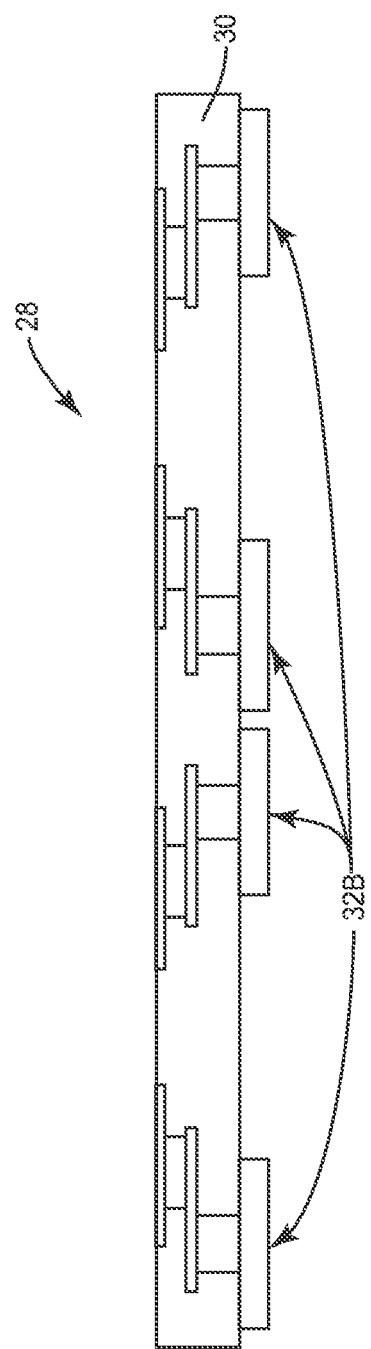

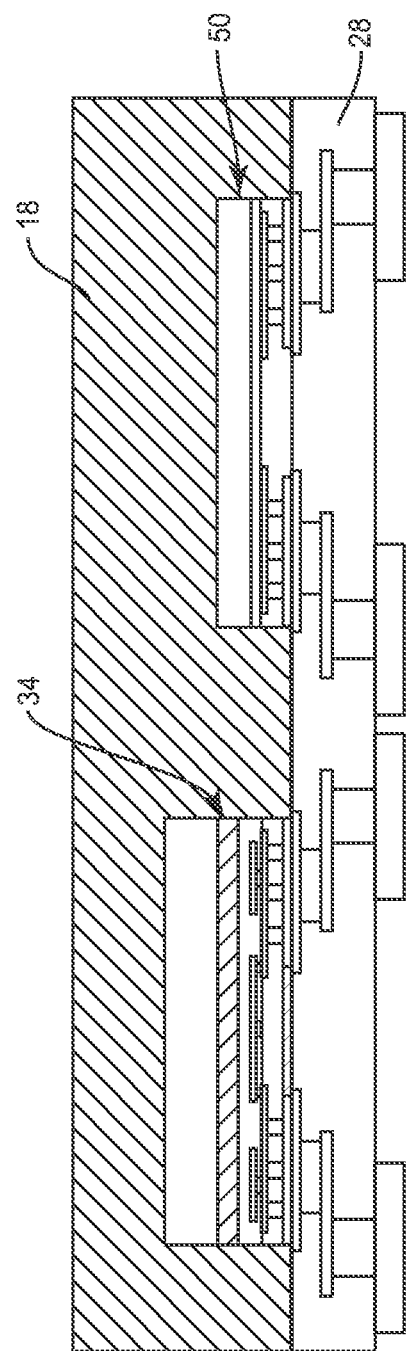

METHOD FOR MANUFACTURING AN INTEGRATED CIRCUIT PACKAGE

RELATED APPLICATIONS

This application is a divisional of U.S. patent application Ser. No. 14/872,910 filed on Oct. 1, 2015, now U.S. Pat. No. 10,085,352, which claims the benefit of provisional patent application Ser. Nos. 62/058,368 and 62/074,429, filed Oct. 1, 2014 and Nov. 3, 2014, respectively, the disclosures of which are hereby incorporated herein by reference in their entirety.

FIELD OF THE DISCLOSURE

This disclosure relates to semiconductor devices and methods for manufacturing the same.

BACKGROUND

Radio frequency complementary metal oxide (RFCMOS) Silicon-on-Insulator (SOI) RF power switches are devices that are essential for practically every mobile handset currently on the market. Existing RFCMOS SOI technologies used to manufacture these devices provide excellent performance in increasingly complex multi-throw RF switches, tunable RF capacitance arrays, and antenna RF tuners. Conventional RFCMOS SOI technologies are built on high resistivity CMOS substrates that have resistivities ranging from 1000 Ohm-cm to 5000 Ohm-cm. A power switch employing RFCMOS SOI technology uses a high resistivity substrate so that a plurality of relatively low voltage field effect transistors (FETs) can be stacked while maintaining a desired isolation between the low voltage FETs.

In an RF switch application for third generation (3G) and fourth generation (4G) wireless applications, a high degree of RF device linearity and a very low level of RF intermodulation under RF power conditions are crucial. Therefore, inherent nonlinearities in RF devices such as CMOS n-type field effect transistor (NFET) devices must be mitigated. Another source of nonlinearities is attributed to a high resistivity silicon handle wafer region interfaced with a buried oxide (BOX) dielectric region. One proposed solution for mitigating these nonlinearities includes a trap rich silicon/oxide interface that degrades carrier lifetimes in the silicon/oxide interface. Other proposed solutions for mitigating the nonlinearities due to the high resistivity handle region interfaced with the BOX dielectric region include harmonic suppression process techniques that include a series of process steps and heating treatments to minimize nonlinearities attributed to the high resistivity handle region interfaced with the BOX dielectric region. However, all the aforementioned proposed solutions add significant complexity and cost to CMOS SOI technology. What is needed are CMOS SOI based semiconductor devices and methods for manufacturing CMOS SOI devices that do not produce the nonlinearities attributed to the high resistivity silicon handle region interfaced with the BOX dielectric region.

SUMMARY

This disclosure relates to integrated circuit (IC) packages and methods of manufacturing the same. In one method, a printed circuit board is provided with semiconductor die. The semiconductor die includes a Back-End-of-Line (BEOL) region, a Front-End-of-Line (FEOL) region, and a semiconductor handle such that the BEOL region, the FEOL region, and the semiconductor handle are stacked. A first polymer layer, such as an overmold, is then provided over the printed circuit board so as to cover the semiconductor die. The semiconductor handle of the semiconductor die is exposed through the first polymer layer and removed. A second polymer layer is then provided so that the BEOL region, the FEOL region, and at least a portion of the second polymer layer are stacked. The second polymer layer may be provided to have high thermal conductivity and electromagnetic isolation properties thereby providing advantageous package characteristics by allowing high thermal conduction yet protecting the semiconductor devices in the FEOL region from electromagnetic radiation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a cross-sectional diagram of an integrated circuit (IC) package.

FIG. 1A is a table that lists thermal, mechanical, electrical, and physical specifications for an exemplary polymer material that may be used to form a polymer layer in the IC packages described in this disclosure.

FIGS. 2A-2H illustrate procedures that may be implemented in order to manufacture the IC package shown in FIG. 1.

FIGS. 3A-3G illustrate procedures that may be implemented in order to manufacture another IC package.

FIGS. 4A-4I illustrate procedures that may be implemented in order to manufacture another IC package.

DETAILED DESCRIPTION

Figure 2A:
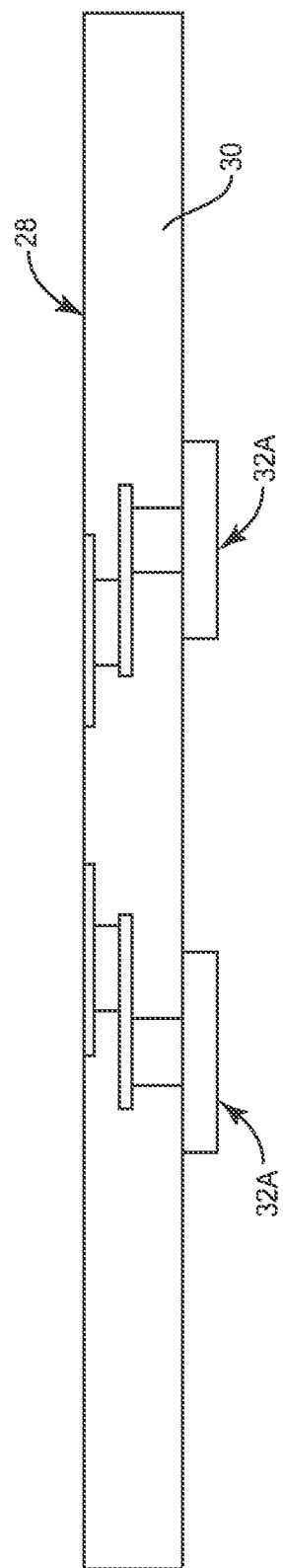

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Traditional Radio frequency complementary metal oxide (RFCMOS) Silicon-on-Insulator (SOI) technologies have reached a fundamental barrier due to limitations inherent to silicon wafer handles that compete with group III-V or sapphire substrates, which have relatively better insulating characteristics available. The disclosed semiconductor device replaces the silicon wafer handle with a polymer substrate. As such, the semiconductor device of this disclosure eliminates the need for a high resistivity silicon wafer handle in a provided semiconductor stack structure, significantly reducing the cost.

Advanced silicon substrates for RF switch applications have resistivities that range from 1000 Ohm-cm to 5000 Ohm-cm and are significantly more costly than standard silicon substrates having much lower resistivities.

Moreover, relatively complex process controls are needed to realize high resistivity in advanced silicon substrates. For these reasons, standard silicon substrates are used ubiquitously in standard SOI technologies. However, standard silicon substrates with their much lower resistivities are not conducive for stacking a plurality of relatively low voltage field effect transistors (FETs) while maintaining a desired isolation between the low voltage FETs. Fortunately, the polymer substrate of the present disclosure replaces the silicon substrate and thus eliminates the problems associated with both high and low-resistivity silicon substrates.

Additionally, the methods of the present disclosure allow for an immediate migration to 300 mm substrates for use in RF power switch applications. This is an important development since there is currently no commercially viable high volume supply of high resistivity RFSOI substrates in the 300 mm wafer diameter format. Fabricating the present semiconductor devices on 300 mm diameter wafers would provide a significant improvement in die costs. Moreover, the need for a trap rich layer and/or harmonic suppression techniques is eliminated, thereby resulting in a significantly simpler process flow and lower cost.

Further still, the polymer substrate is expected to eliminate RF nonlinear effects resulting from the interface between the BOX layer and the silicon substrate used in traditional semiconductor processes to manufacture RF switch devices. The present methods realize RF switch devices that have linear characteristics relatively close to ideal linear characteristics.

Additionally, the semiconductor device of this disclosure offers a near ideal voltage stacking of NFET transistors. Traditionally, the number of NFET devices that can be stacked is limited by silicon substrate resistivity combined with the interface effects between the BOX layer and the silicon wafer handle. This issue essentially limits the number of practical NFET transistors that can be stacked and thus limits the highest RF operating voltage for the resulting NFET transistor stack. Replacing silicon wafer handles with the polymer substrate of the present disclosure allows relatively many more NFET transistors to be practically ideally stacked. The resulting semiconductor device is operable at relatively much higher RF power levels and RMS voltages than is traditionally allowable on silicon handle wafer technologies.

Furthermore, the highest RF frequency of operation of RF power switches built with the disclosed polymer substrate can be extended beyond the highest frequency of operation achievable with traditional RFCMOS SOI technologies. Replacing the silicon handle eliminates a considerable amount of parasitic capacitance, which helps extend the operating frequency range. It also allows for the use of relatively cheap silicon wafer handles since the silicon wafer handle is to be removed. Typically, a silicon wafer handle resistivity is in the range of 1000-3000 Ohm-cm, which effectively imposes an operational high frequency limit. The resulting resistivity of the polymer substrate region in the semiconductor device taught in this disclosure is several orders of magnitude higher than what is achieved in high resistivity silicon. For instance, there are polymers with nearly ideal electrically insulating characteristics, with resistivity values similar to what is obtained in gallium arsenide (GaAs) and sapphire semi-insulating substrates.

FIG. 1 is a cross-sectional diagram of an integrated circuit (IC) package 10. The IC package 10 includes a printed circuit board 12, a Back-End-of-Line (BEOL) region 14 mounted on the printed circuit board 12, a Front-End-of-Line (FEOL) region 16, a first polymer layer 18 provided over the printed circuit board 12, and a second polymer layer 20. The FEOL region 16 is formed from doped and/or undoped semiconductor layers that are used to form active semiconductor devices, such as transistors (like the field effect transistors (FETs) illustrated in FIG. 1), diodes, varactors, and/or the like. In some embodiments, in addition to the active semiconductor devices, the FEOL region 16 may include passive semiconductor devices, such as passive capacitors and passive inductors.

The BEOL region 14 is formed from an interlayer dielectric (ILD) and metal layers and conductive vias that are used to form the interconnections for the devices housed within the IC package 10. The BEOL region 14 is configured to couple the components on the FEOL region 16 to one another. Terminus may also be provided by the BEOL region 14 to provide connections by external components to the IC. The BEOL region 14 may also be used to form passive impedance elements. In this embodiment, the BEOL region 14 has conductive pads that have flip-chip bumps to provide external connections.

The printed circuit board 12 is a substrate. The printed circuit board 12 is formed from a substrate body and a metallic structure. The first polymer layer 18 is formed from a typical overmolding material as explained in further detail below. The second polymer layer 20 is formed from a specialized polymer material that is capable of providing good thermal conductivity while still providing electric isolation. As shown in FIG. 1, the IC package 10 also includes a buried oxide (BOX) layer 22 that is stacked between the FEOL region 16 and the second polymer layer 20. The BEOL region 14, the FEOL region 16, the BOX layer 22 and a portion 24 of the second polymer layer 20 are stacked and surrounded by the first polymer layer 18. In this embodiment, the BEOL region 14 includes flip chip bumps that are attached to the metallic structure. A portion 26 of the second polymer layer 20 is provided over the portion 24 and the first polymer layer 18. The second polymer layer 20 may be provided as a very high resistivity polymer which leaves the FETs in the FEOL region 16 that may leave the FETs essentially floating. As such, the parasitic capacitance between the portion 24 and the FETs is substantially reduced in comparison to the parasitic capacitance between the FETs and a silicon handle.

FIG. 1A is a specification table that lists thermal, mechanical, electrical, and physical specifications for an exemplary polymer material that is usable to form the second polymer layer 20 of the IC package 10. It is to be understood that the specification table only provides exemplary specifications and that a variety of mechanical and physical properties are available within the scope of the present disclosure. Moreover, the quantitative values for the thermal and electrical properties provided in the table of FIG. 1A only represent exemplary values that are within the range of thermal and electrical properties already discussed in the above disclosure.

Figure 2B:
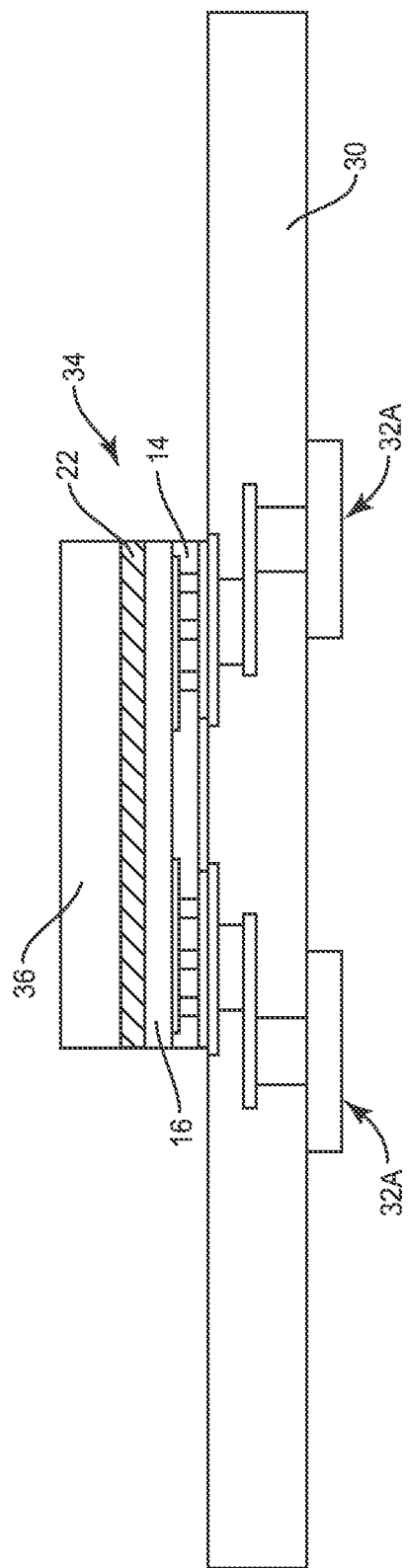

FIGS. 2A-2H illustrate procedures that may be implemented in order to manufacture the IC package 10 shown in FIG. 1. To begin, a printed circuit board 28 is provided (FIG. 2A). The printed circuit board 28 is a meta-board and will be used to create the printed circuit board 12 shown in FIG. 1 when the IC package 10 is singulated. The printed circuit board 28 includes a substrate body 30 formed from an insulating material and a metallic structure 32A integrated into the substrate body 30. Next, a semiconductor die 34 is mounted on the printed circuit board 28 (FIG. 2B). The semiconductor die 34 is attached to the metallic structure 32A. In this embodiment, flip-chip bumps of the semiconductor die 34 are soldered to conductive pads of the metallic structure 32A on a surface of the substrate body 30. Bumping techniques may include conventional solder bumps, Chip Scale Packaging (CSP), and copper pillar bumping. The bumping techniques apply equally well to any of these bump packaging approaches. The flip-chip bumps in this case are made of a conventional solder metallic alloy. Alternatively, conventional copper pillar technology could also be used. The semiconductor die 34 is mounted with the flip-chip bumps on a printed circuit board 28, and the flip-chip bumps are reflown using a pre-determined thermal cycle.

The semiconductor die 34 includes the BEOL region 14, the FEOL region 16, the BOX layer 22, and a semiconductor handle 36. The BEOL region 14, the FEOL region 16, the BOX layer 22, and the semiconductor handle 36 are stacked. In this embodiment, the semiconductor handle 36 is stacked on and over the BOX layer 22, the BOX layer 22 is stacked on and over the FEOL region 16, and the FEOL region 16 is stacked on and over the BEOL region 14. The BEOL region 14 is mounted on the printed circuit board 28 with the flip chip bumps. In this embodiment, an underfill support layer 38 is formed underneath and around the semiconductor die 34 on the printed circuit board 28 (FIG. 2C). This procedure is optional but provides additional support and helps maintain the integrity of the BEOL region 14, the FEOL region 16, and the BOX layer 22, after the semiconductor handle 36 is removed. To form the underfill support layer 38, a polymeric type of underfill compound may be injected around the semiconductor die 34. Then, during a heat curing stage, the underfill compound reflows to preferably penetrate under the semiconductor die 34 and form the underfill support layer 38 with a permanent region under the semiconductor die 34. This offers a more uniform support region under the semiconductor die 34 which helps prevent bending and/or breaking of the semiconductor die 34 later when the first polymer layer 18 (shown in FIG. 1) and the second polymer layer 20 (shown in FIG. 1) are provided.

Next, the first polymer layer 18 is provided over the printed circuit board 28 so that the first polymer layer 18 covers the semiconductor die 34 (FIG. 2D). In this embodiment, the first polymer layer 18 is an overmold. The overmold may be made from an insulating or dielectric material that helps to electrically isolate the BEOL region 14, the FEOL region 16, and the BOX layer 22. For example, the first polymer layer 18 may be provided as an overmold made from thermoset polymeric materials specially designed for the semiconductor packaging industry. These thermoset polymeric materials typically have fillers such as small 10-50 um diameter silica spheres to improve the molding characteristics of the thermoset polymeric materials. Due to their nature, these thermoset polymeric materials typically have low thermal conductivity values, in the range of 0.8-3 W/mK.

Figure 2E:
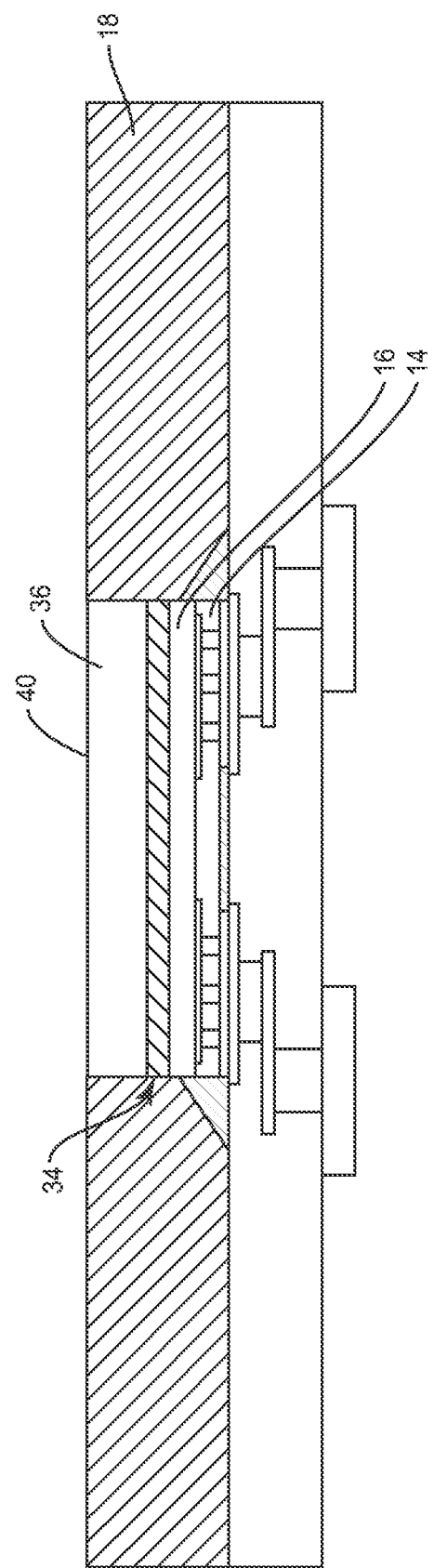

An area of the semiconductor handle 36 is then exposed through the first polymer layer 18 (FIG. 2E). In this embodiment, the first polymer layer 18 is ground to remove a portion of the first polymer layer 18 above a top surface 40 of the semiconductor die 34, and thus the area of the semiconductor handle 36 exposed through the first polymer layer 18 is the top surface 40 of the semiconductor handle 36. This may be accomplished with a normal grinding wheel operation, but possibly a 'routing' cutter such as one available in a Computer Numerical Control (CNC) tool. In this embodiment, the semiconductor handle 36 is made from Silicon (Si), and the semiconductor die 34 is an SOI semiconductor die since the BOX layer 22 is stacked between the FEOL region 16 and the semiconductor handle 36. The semiconductor handle 36 may also be thinned as part of this operation, which may also be highly desirable in the cases where the overall thickness of the final product needs to be minimized.

Figure 2F:
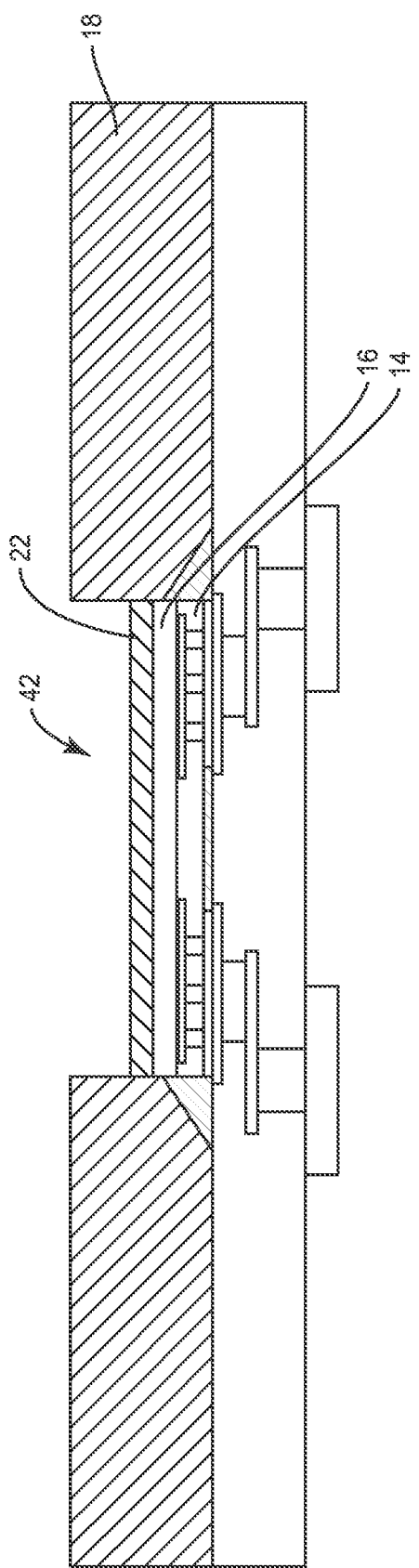

After exposing the area (e.g., the top surface 40) of the semiconductor handle 36 through the first polymer layer 18, the semiconductor handle 36 is removed to provide a void 42 in the first polymer layer over the BOX layer 22, BEOL region 14 and the FEOL region 16 (FIG. 2F). The semiconductor handle 36 may be removed through chemical etching where the BOX layer 22 provides a stop to the chemical etch. The chemical etch may be a wet etch or a dry etch. The wet or dry etching of the semiconductor handle 36 may be engineered to create a roughening of the first polymer layer 18. This roughening may be highly desirable so as to improve the adhesion of the second polymer layer 20 (shown in FIG. 1) employed in the later portions of this process. One way to achieve this roughening is by employing a wet chemistry such as KOH:H2O which causes the surface silica spheres (the fillers) in the mold compound to etch away, leaving 'craters' in the location where the spheres were present. These craters rough up the surface of the overmold compound and provide significant improvement in the adhesion of subsequent coatings.

Alternatively, the semiconductor handle 36 may also be etched by a well know silicon dry etch chemistry. For example, Xenon Difluoride ($XeFe_2$) based gases may be employed as a dry etch. This dry etch technique provides an excellent silicon etch selectivity over oxide, nitrides and even polymer regions. The dry-etch process may be a relatively low temperature and non-plasma in nature. It should be noted that this dry etch technique can be temporally and economically expensive when the semiconductor handle 36 is 100-200 um or greater. Regardless of whether wet etching or dry etching is implemented, the semiconductor handle 36 is preferably substantially entirely etched away so that none remains after removal.

Figure 2G:
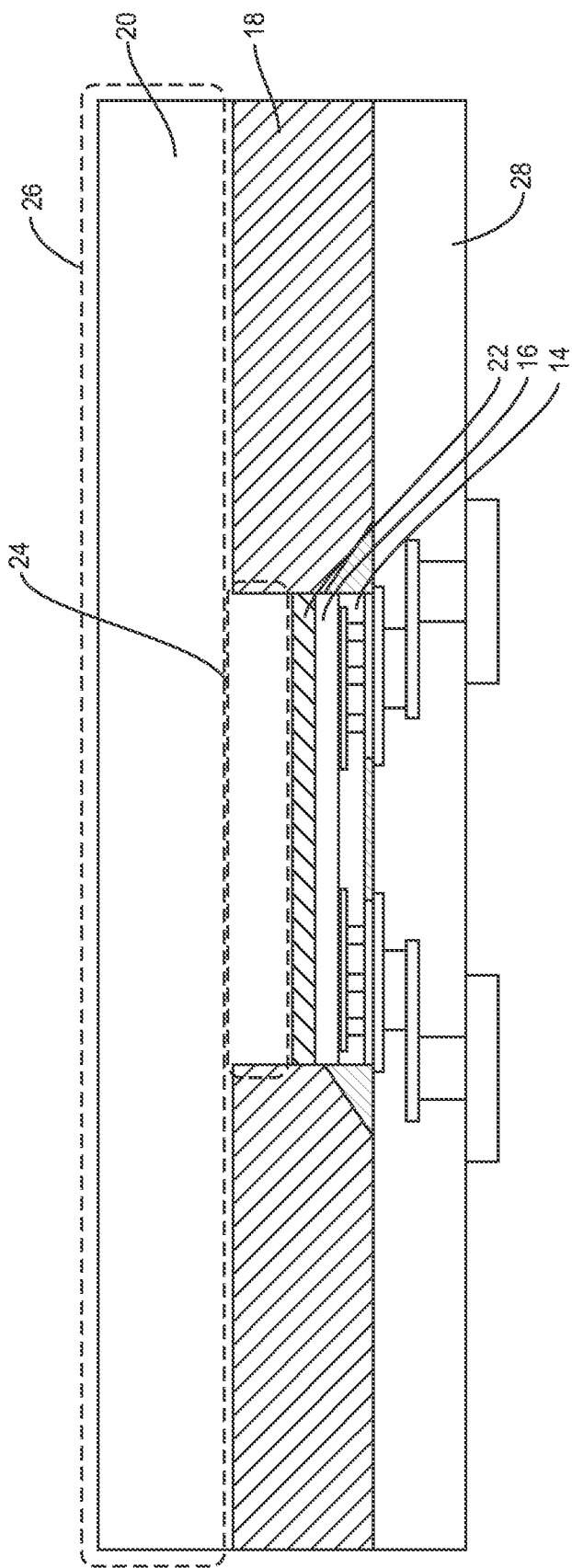
Figure 2H:
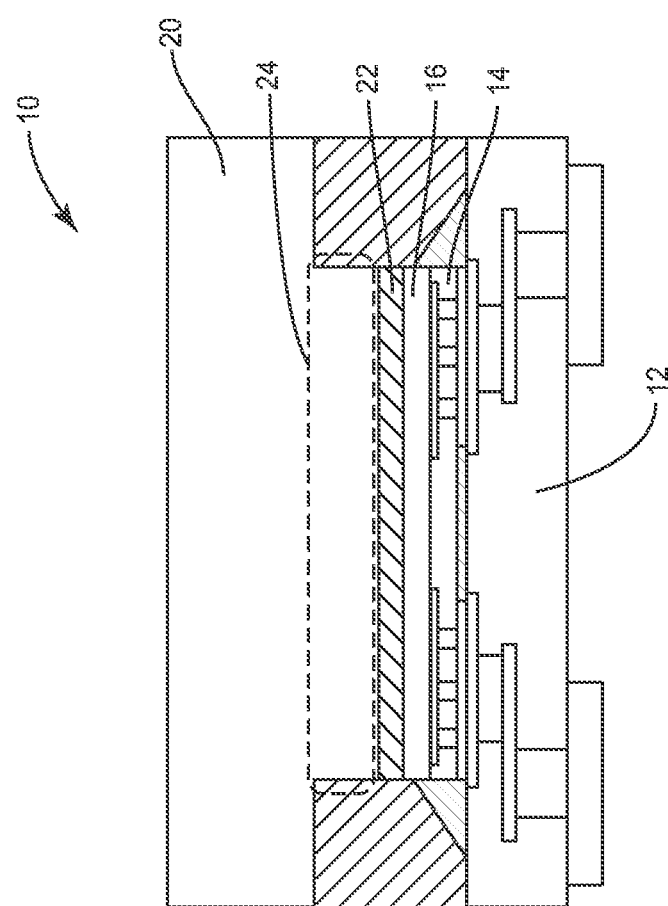

As such, in this embodiment, the BOX layer 22 is exposed by the void 42. The BOX layer 22 provides a bottom surface of the void 42. The second polymer layer 20 is provided at least within the void 42 (see FIG. 2F) so that the BEOL region 14, the FEOL region 16, the BOX layer 22 and at least the portion 24 of the second polymer layer 20 within the void 42 are stacked (FIG. 2G). The second polymer layer 20 may be formed by a plurality of different techniques. Such techniques may include simple injection and compression molding techniques, spun-on deposition, sprayed-on type of processes, or even simple dispensing of polymer compound in a pattern. In this embodiment, the second polymer layer 20 also has the portion 26 that is provided over the portion 24 and the first polymer layer 18. In other embodiments, the void 42 may simply be filled so that the second polymer layer 20 is only provided in the void 42. The second polymer layer 20 is more thermally conductive than the first polymer layer 18 and has a higher resistivity than the semiconductor handle 36 (shown in FIG. 2E), which is made of Silicon. Again, FIG. 1A illustrates exemplary thermal and electronic characteristics for the second polymer layer 20. In this embodiment, the IC package 10 is singulated so that a portion of the printed circuit board 28 (shown in FIG. 2G) is provided as the printed circuit board 12 of the IC package 10 (FIG. 2H). As shown, the semiconductor handle 36 (shown in FIG. 2B) is not provided between the portion 24 of the second polymer layer 20 and the BOX layer 22, the FEOL region 16 and the BEOL region 14.

Figure 3B:
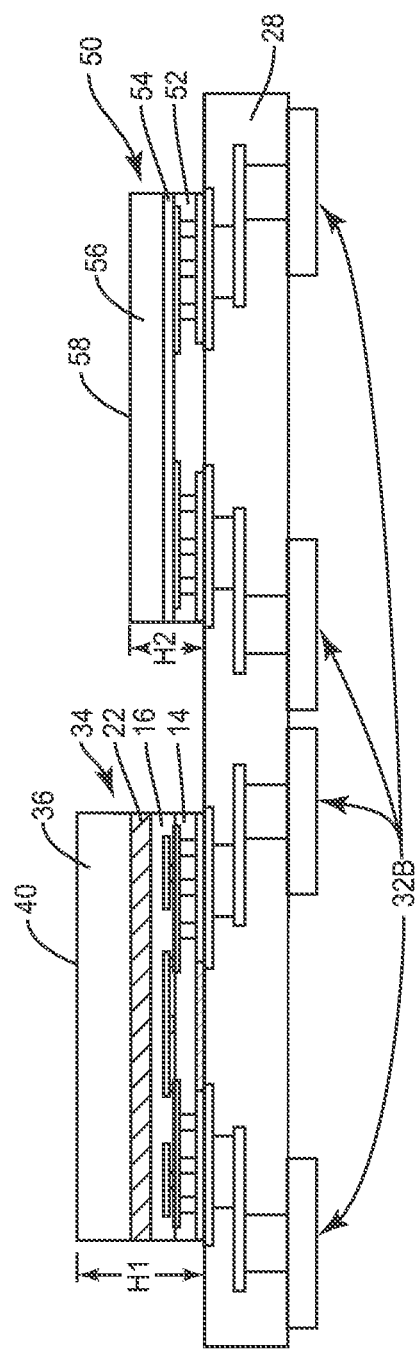

FIGS. 3A-3G illustrate procedures that may be implemented in order to manufacture another IC package. To begin, a printed circuit board 28 is provided (FIG. 3A). The printed circuit board 28 is a meta-board and will be used to create the printed circuit board of the IC package once singulated. The printed circuit board 28 includes the substrate body 30 formed from an insulating material and a metallic structure 32B integrated into the substrate body 30. Next, the semiconductor die 34 and a semiconductor die 50 are mounted on the printed circuit board 28 (FIG. 3B). The semiconductor die 34 and the semiconductor die 50 are attached to the metallic structure 32B. In this embodiment, flip-chip bumps of the semiconductor die 34 and the flip-chip bumps of the semiconductor die 50 are soldered to conductive pads of the metallic structure 32B on a surface of the substrate body 30. The semiconductor die 34 is the same semiconductor die 34 described above with respect to FIG. 2A.

The semiconductor die 50 includes a BEOL region 52, an FEOL region 54, and a semiconductor handle 56. In this embodiment, the semiconductor handle 56 is made from Gallium Arsenide (GaAs), and thus the semiconductor die 50 is a GaAs semiconductor die. The BEOL region 52, the FEOL region 54, and the semiconductor handle 56 are stacked. In this embodiment, the semiconductor handle 56 is stacked on and over the FEOL region 54, and the FEOL region 54 is stacked on and over the BEOL region 52. The BEOL region 52 is mounted on the printed circuit board 28 with the flip-chip bumps. It should be noted that while the semiconductor die 50 is a GaAs semiconductor die, the semiconductor die 50 may be formed in accordance with other types of IC technology, such as CMOS, bipolar, Metal on Metal Substrates, and the like.

With regard to the semiconductor die 34, the BEOL region 14 is attached to the printed circuit board 28. The FEOL region 16 is stacked between the BEOL region 14, the BOX layer 22, and the semiconductor handle 36. The semiconductor handle 36 has the top surface 40 at a first height H1 above the printed circuit board 28. With regard to the semiconductor die 50, the BEOL region 52 is attached to the printed circuit board 28. The FEOL region 54 is stacked between the BEOL region 52 and the semiconductor handle 56. The semiconductor handle 56 has a top surface 58 at a second height H2 above the printed circuit board 28. The second height H2 is less than the first height H1 (i.e., the first height H1 is greater than the second height H2).

For example, if the height H1 of the semiconductor die 34 is 200 um, and the height H2 is 100 um thick, a Grind-and-Reveal operation would only expose the semiconductor handle 36 and not the semiconductor handle 56, leaving the semiconductor die 50 completely enclosed and protected by the first polymer layer 18. Further polymer molding operations of course would only contact the semiconductor handle 36 and not the other semiconductor die 50 where such process is not desirable.

Figure 3D:
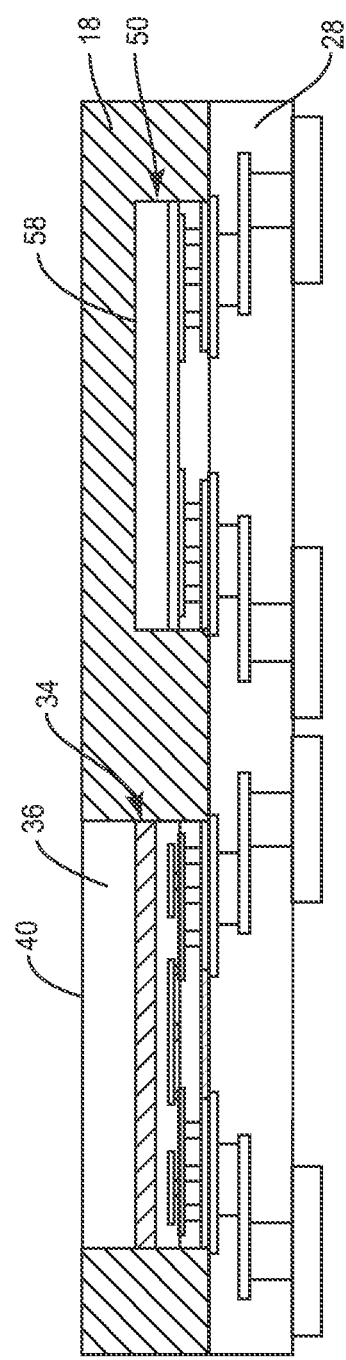

Next, the first polymer layer 18 is provided over the printed circuit board 28 so that the first polymer layer 18 covers the semiconductor die 34 and the semiconductor die 50 (FIG. 3C). An area of the semiconductor handle 36 is then exposed through the first polymer layer 18 (FIG. 3D). In this embodiment, the first polymer layer 18 is ground to remove a portion of the first polymer layer 18 above a top surface 40 of the semiconductor die 34 and thus the area of the semiconductor handle 36 exposed through the first polymer layer 18 is the top surface 40 of the semiconductor handle 36. In this embodiment, the semiconductor handle 36 is made from Silicon (Si), and the semiconductor die 34 is an SOI semiconductor die, since the BOX layer 22 is stacked between the FEOL region 16 and the semiconductor handle 36. However, since the first height H1 is greater than the second height H2, the semiconductor die 50 is not exposed through the first polymer layer 18.

Figure 3E:
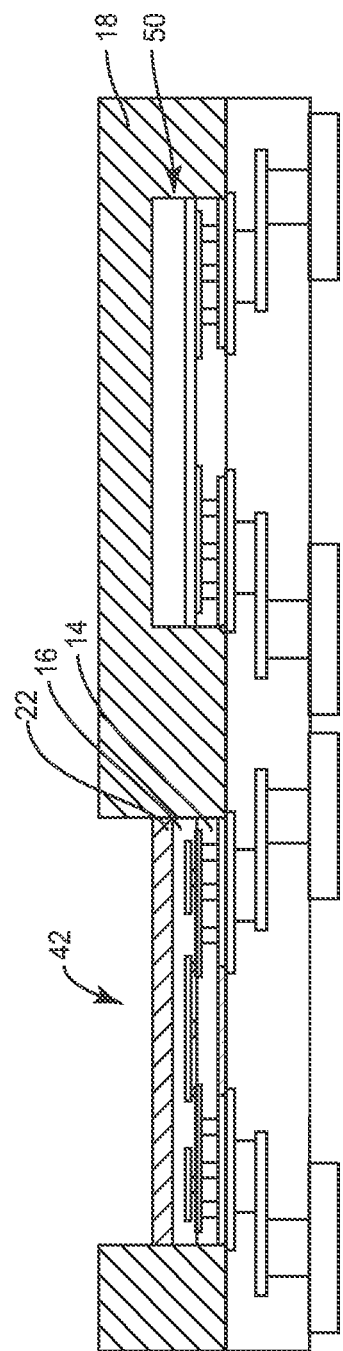
Figure 3F:
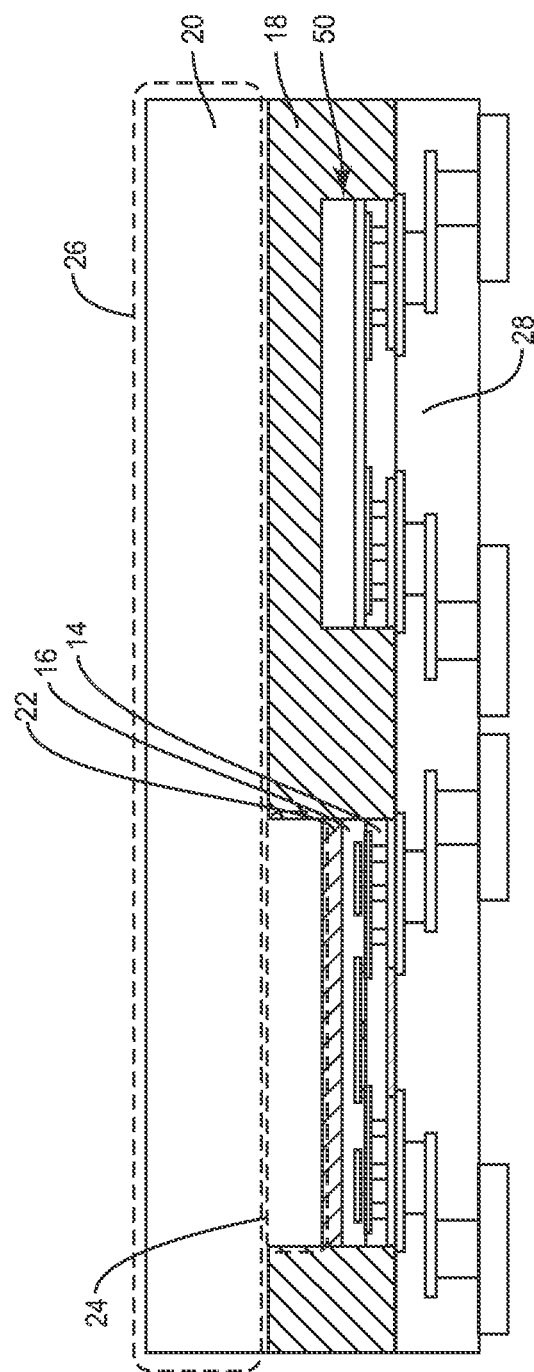
Figure 3G:
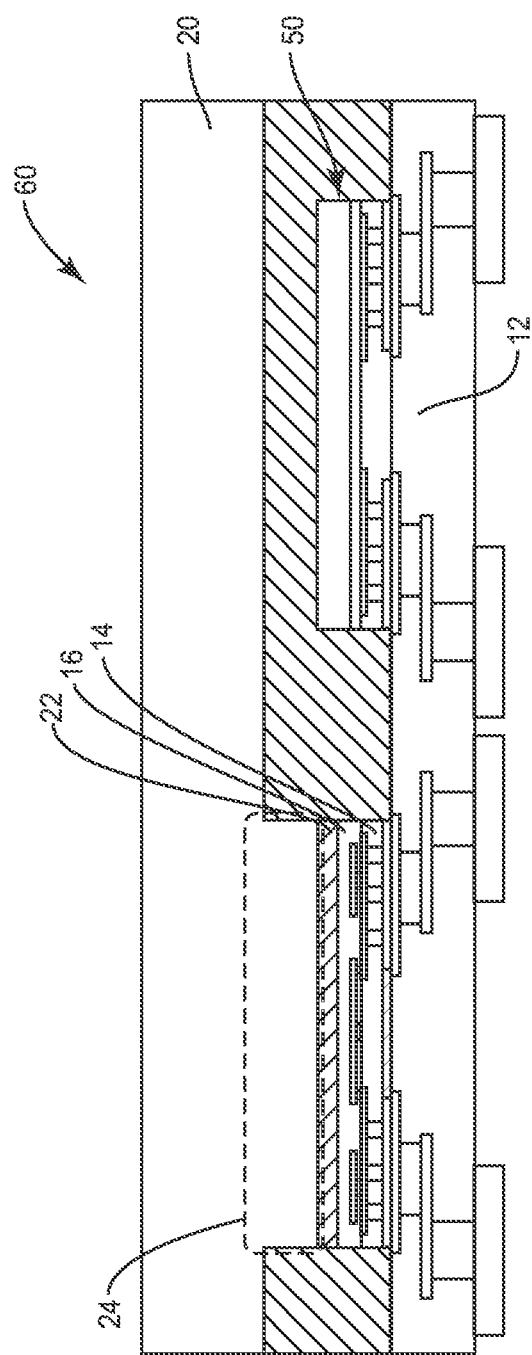

After exposing the area (e.g., the top surface 40) of the semiconductor handle 36 through the first polymer layer 18, the semiconductor handle 36 is removed to provide the void 42 in the first polymer layer over the BOX layer 22, BEOL region 14 and the FEOL region 16 (FIG. 3E). In this embodiment, the BOX layer 22 is exposed by the void 42. The BOX layer 22 provides a bottom surface of the void 42. The second polymer layer 20 is provided at least within the void 42 (see FIG. 3E) so that the BEOL region 14, the FEOL region 16, the BOX layer 22 and at least the portion 24 of the second polymer layer 20 within the void 42 are stacked (FIG. 3F). In this embodiment, the second polymer layer 20 also has the portion 26 that is provided over the portion 24, the first polymer layer 18, and the semiconductor die 50. In other embodiments, the void 42 may simply be filled so that the second polymer layer 20 is only provided in the void 42. The second polymer layer 20 is more thermally conductive than the first polymer layer 18 and has a higher resistivity than the semiconductor handle 36 (shown in FIG. 3D), which was made of Silicon. Again, FIG. 1A illustrates exemplary thermal and electronic characteristics for the second polymer layer 20. In this embodiment, an IC package 60 is singulated so that a portion of the printed circuit board 28 (shown in FIG. 3F) is provided as the printed circuit board 12 of the IC package 60 (FIG. 3G). As shown, the semiconductor handle 36 (shown in FIG. 3B) is not provided between the portion 24 of the second polymer layer 20 and the BOX layer 22, the FEOL region 16 and the BEOL region 14.

Figure 4A:
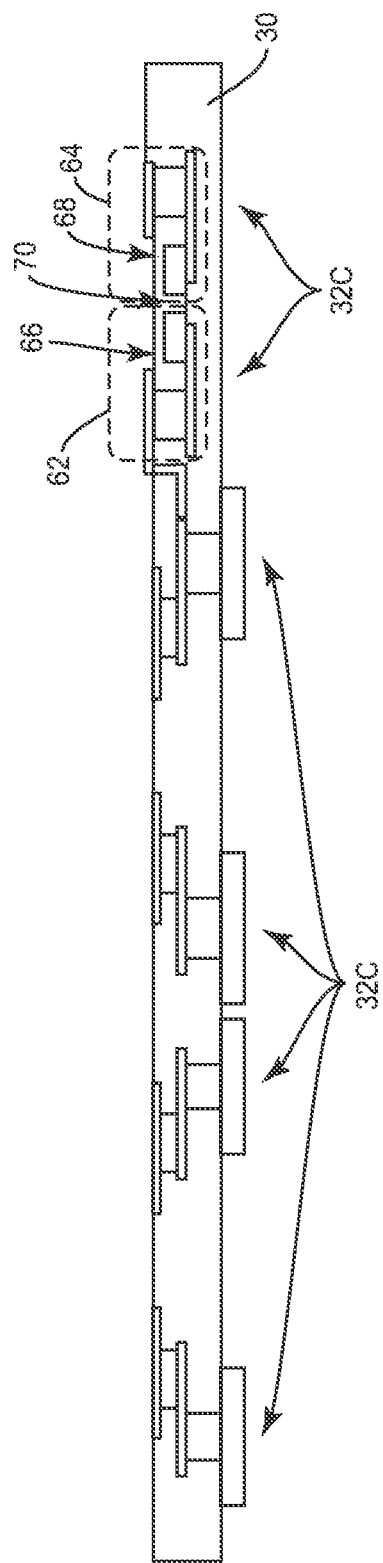

FIGS. 4A-4I illustrate procedures that may be implemented in order to manufacture another IC package. To begin, the printed circuit board 28 is provided (FIG. 4A). The printed circuit board 28 is a meta-board and will be used to create the printed circuit board of the IC package once singulated. The printed circuit board 28 includes the substrate body 30 formed from an insulating material and a metallic structure 32C integrated into the substrate body 30. The metallic structure 32C not only includes metallic portions for semiconductor dies but also forms a three dimensional (3D) inductor 62 and a 3D inductor 64. The 3D inductor 62 and the 3D inductor 64 are adjacent to one another. An interior 66 of the 3D inductor 62 is filled by the substrate body 30, and an interior 68 of the 3D inductor 64 is filled by the substrate body 30. An inter-inductor volume 70 between the inductors 62, 64 are also filled by the substrate body 30.

Figure 4B:
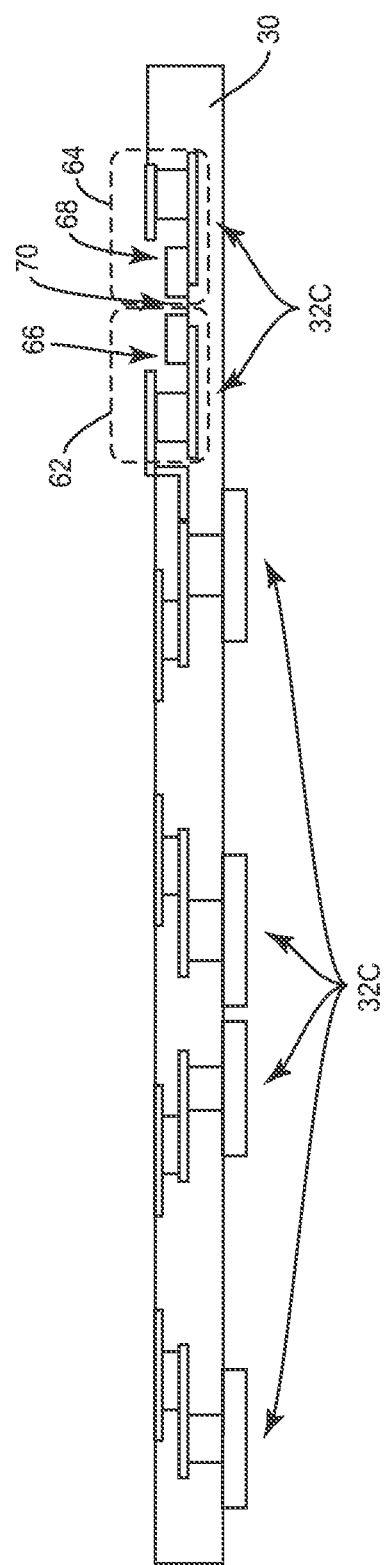
Figure 4C:
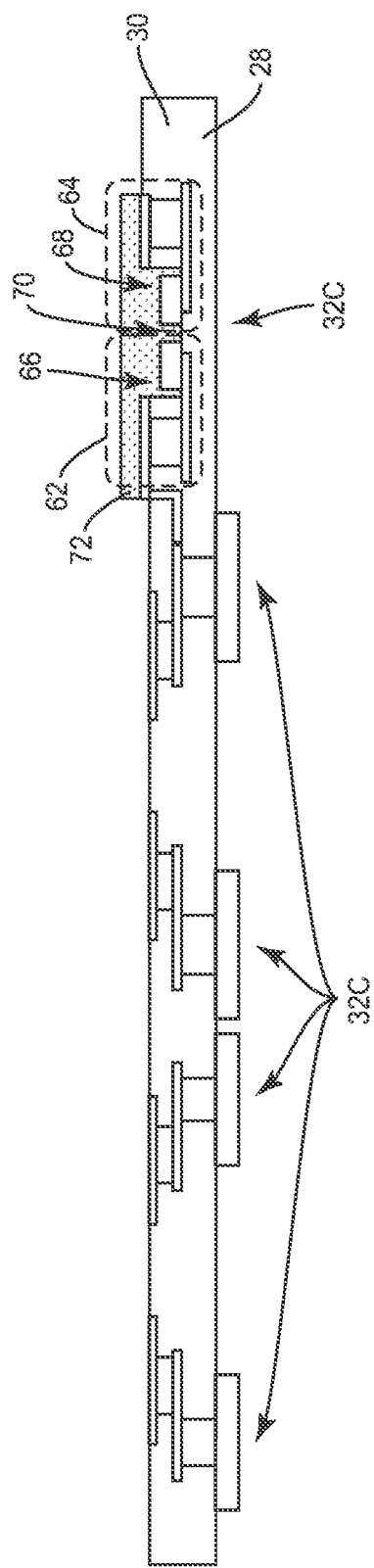

Next, a portion of the substrate body 30 in the interior 66 of the 3D inductor 62, a portion of the substrate body 30 in the interior 68 of the 3D inductor 64, and a portion of the substrate body 30 in the inter-inductor volume 70 are removed (FIG. 4B). After removing the portion of the substrate body 30 in the interior 66 of the 3D inductor 62, the portion of the substrate body 30 in the interior 68 of the 3D inductor 64, and the portion of the substrate body 30 in the inter-inductor volume 70, the interior 66 of the 3D inductor 62, the interior 68 of the 3D inductor 64, and the interior 68 of the 3D inductor 64 are filled with a magnetic material 72 (FIG. 4C). In this manner, the 3D inductor 62 and the 3D inductor 64 may be weakly magnetically coupled where the ferromagnetic characteristics of the magnetic material 72 determine the coupling factor between the 3D inductor 62 and the 3D inductor 64. It should be noted that the magnetic material 72 may be a ferromagnetic material, and/or the like.

Figure 4D:
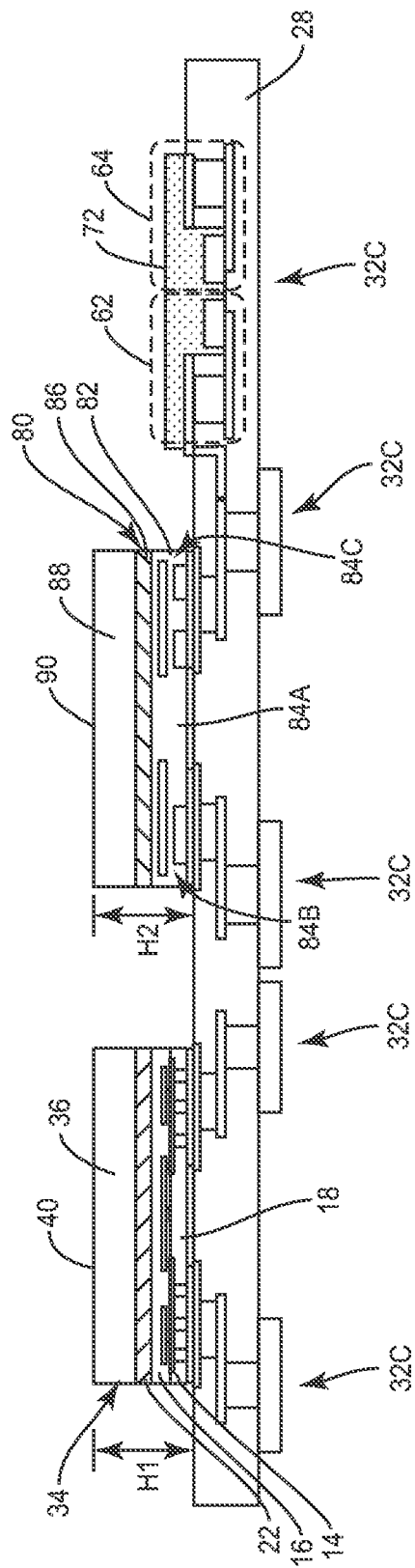

Next, the semiconductor die 34 and a semiconductor die 80 are mounted on the printed circuit board 28 (FIG. 4D). The semiconductor die 34 and the semiconductor die 80 are attached to the metallic structure 32C. In this embodiment, flip-chip bumps of the semiconductor die 34 and the flip-chip bumps of the semiconductor die 80 are soldered to conductive pads of the metallic structure 32C on a surface of the substrate body 30. The semiconductor die 34 is the same semiconductor die 34 described above with respect to FIG. 2A.

The semiconductor die 80 includes a BEOL region 82 formed from an ILD 84A and having passive capacitors 84B, and passive inductors 84C, an insulating layer 86, and a semiconductor handle 88. In this embodiment, the semiconductor handle 88 is made from Silicon (Si), and thus the semiconductor die 80 is a silicon semiconductor die. Additionally, no FEOL region is provided but rather the passive capacitors 84B and passive inductors 84C are provided in the BEOL region 82. Thus, the semiconductor die 80 is an integrated passive device die.

With regard to the BEOL region 82, the passive capacitors 84B may be metal on metal (MOM) capacitors and/or metal insulator metal (MIM) capacitors. The BEOL region 82, the insulating layer 86 and the semiconductor handle 88 are stacked. In this embodiment, the semiconductor handle 88 is stacked on and over the insulating layer 86 and the insulating layer 86 is stacked on and over the BEOL region 82. The BEOL region 82 is mounted on the printed circuit board 28 with the flip chip bumps. With regard to the semiconductor die 34, the BEOL region 14 is attached to the printed circuit board 28. The FEOL region 16 is stacked between the BEOL region 14 and the semiconductor handle 36. The semiconductor handle 36 has the top surface 40 at the first height H1 above the printed circuit board 28. With regard to the semiconductor die 80, the BEOL region 82 is attached to the printed circuit board 28. The insulating layer 86 is stacked between the BEOL region 82 and the semiconductor handle 88. The semiconductor handle 88 has the top surface 90 at a second height H2 above the printed circuit board 28. The second height H2 is approximately equal to than the first height H1.

Figure 4E:
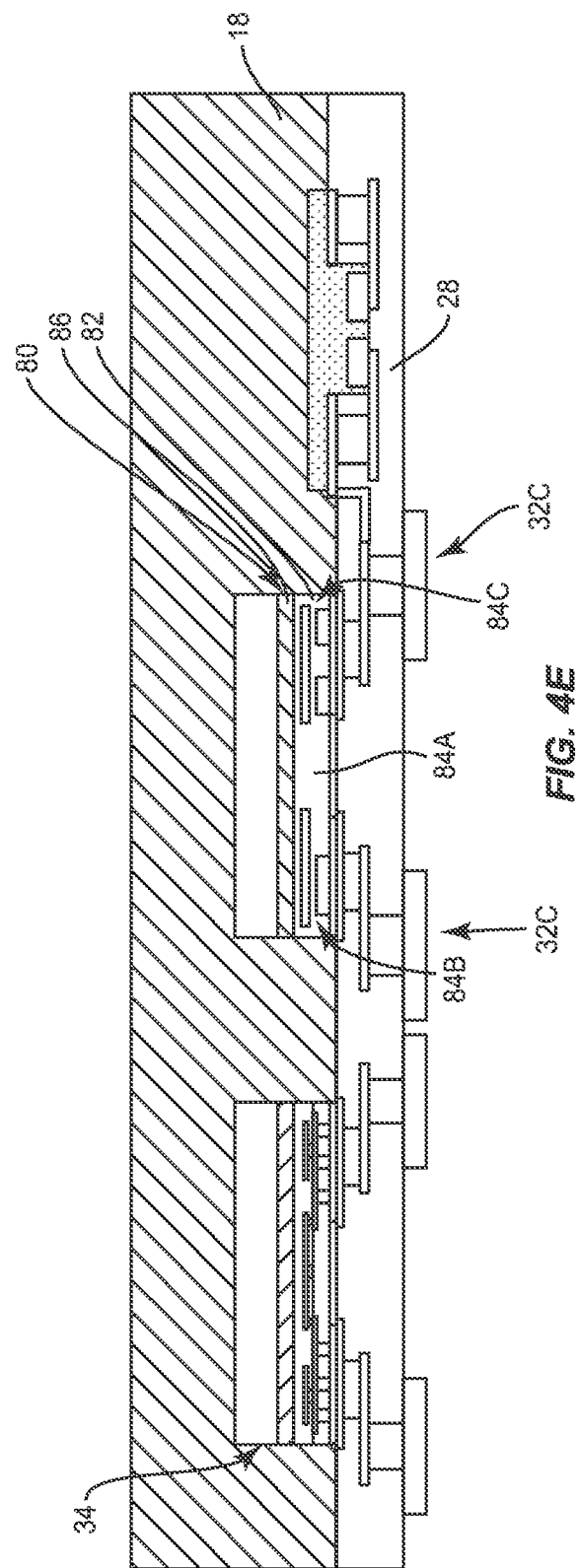
Figure 4F:
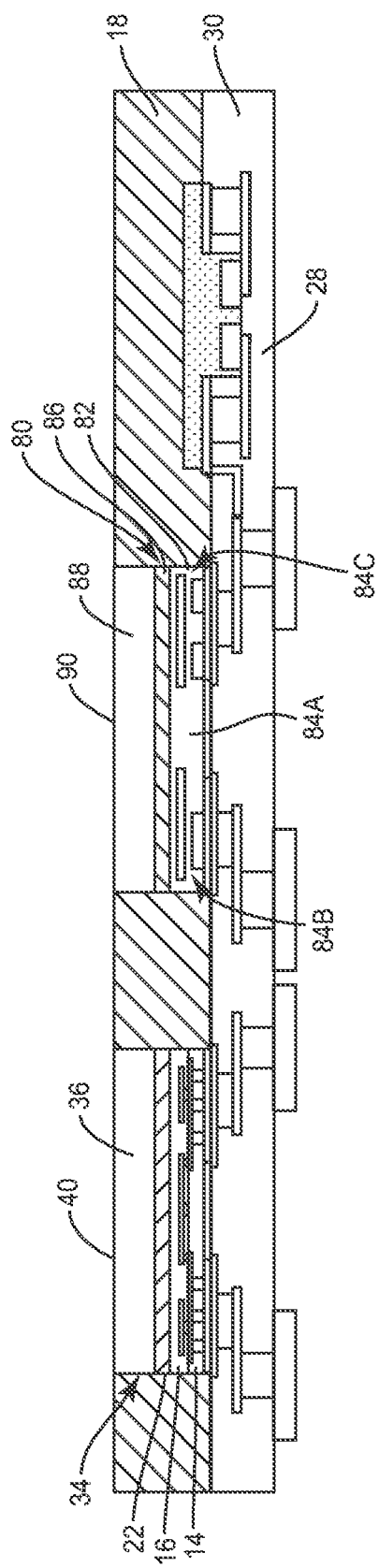

Next, the first polymer layer 18 is provided over the printed circuit board 28 so that the first polymer layer 18 covers the semiconductor die 34 and the semiconductor die 80 (FIG. 4E). An area of the semiconductor handle 36 and an area of the semiconductor handle 88 are then exposed through the first polymer layer 18 (FIG. 4F). In this embodiment, the first polymer layer 18 is ground to remove a portion of the first polymer layer 18 above the top surface 40 of the semiconductor die 34, and thus the area of the semiconductor handle 36 exposed through the first polymer layer 18 is the top surface 40 of the semiconductor handle 36. Also, since the height H2 is approximately equal to the height H2, the first polymer layer 18 is ground to remove the portion of the first polymer layer 18 above the top surface 90 of the semiconductor die 80, and thus the area of the semiconductor handle 88 exposed through the first polymer layer 18 is the top surface 90 of the semiconductor handle 88. In this embodiment, the semiconductor handle 88 is made from Silicon (Si). However, since the first height H1 is approximately the same as the second height H2, the semiconductor die 80 is exposed through the first polymer layer 18.

Figure 4G:
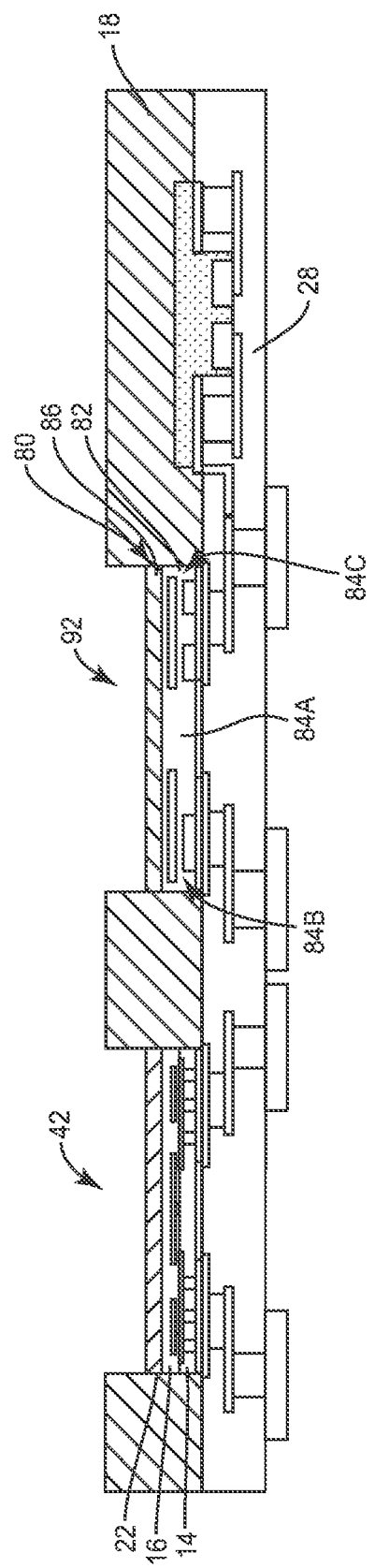
Figure 4H:
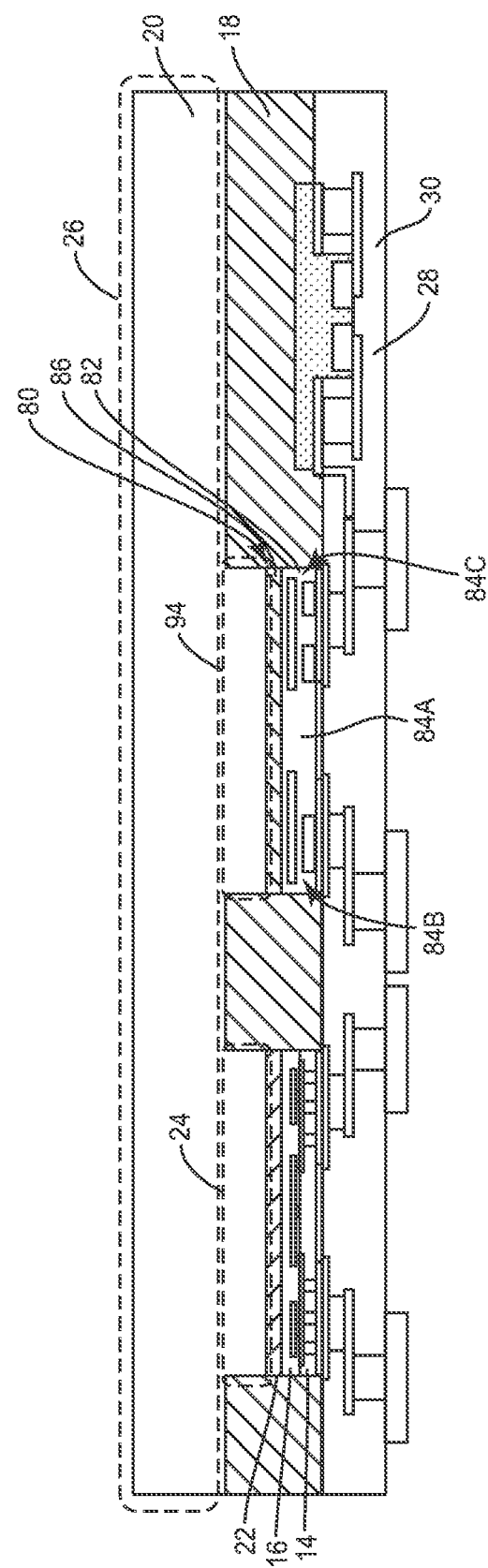
Figure 41:
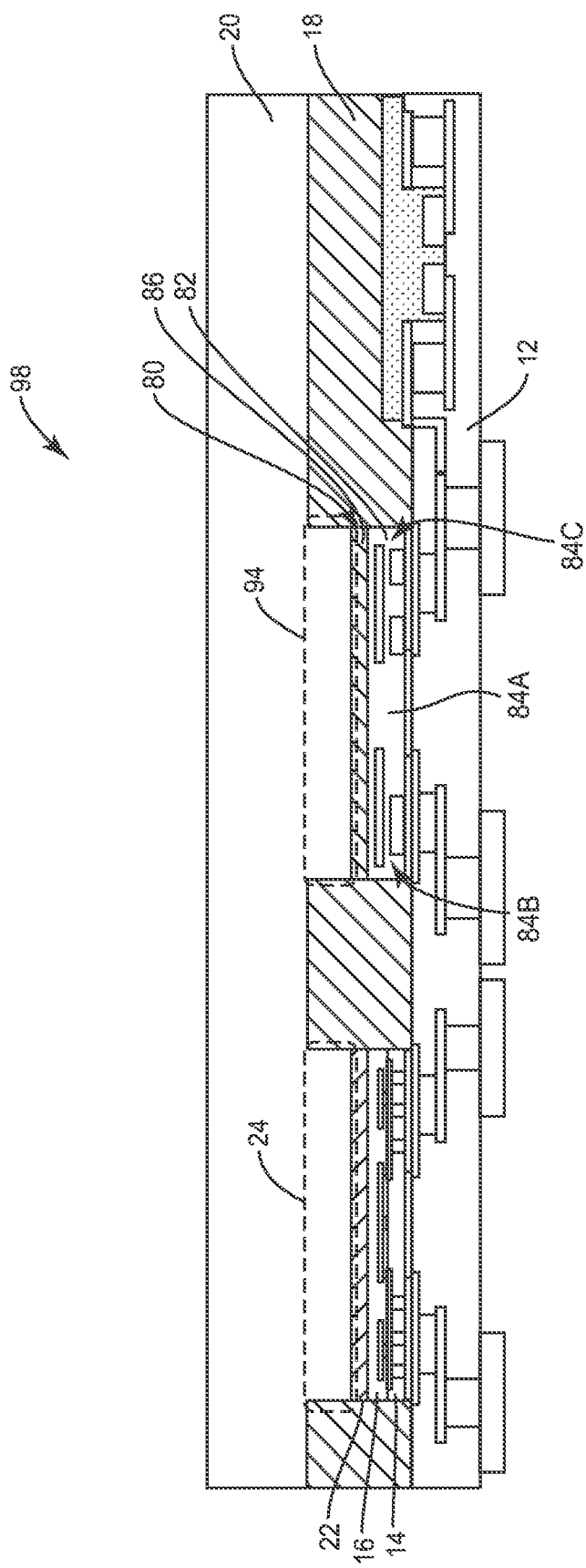

After exposing the area (e.g., the top surface 40) of the semiconductor handle 36 through the first polymer layer 18 and after exposing the area (e.g., the top surface 90) of the semiconductor handle 88, the semiconductor handle 36 and the semiconductor handle 88 are removed to provide the void 42 over the BOX layer 22, BEOL region 14 and the FEOL region 16 and to provide a void 92 over the insulating layer 86 and the BEOL region 82 (FIG. 4G). In this embodiment, the BOX layer 22 is exposed by the void 42 and the insulating layer 86 is exposed by the void 92. Thus, the BOX layer 22 provides a bottom surface of the void 42 and the insulating layer 86 provides a bottom surface of the void 92. The second polymer layer 20 is provided at least within the void 42 (see FIG. 4G) and within the void 92 (see FIG. 4G) (FIG. 4H). In this manner, the BEOL region 14, the FEOL region 16, the BOX layer 22 and at least the portion 24 of the second polymer layer 20 within the void 42 are stacked. Additionally, the BEOL region 82, the insulating layer 86 and at least a portion 94 of the second polymer layer 20 within the void 92 are stacked. In this embodiment, the second polymer layer 20 also has the portion 26 that is provided over the portion 24, the portion 94, and the first polymer layer 18 The second polymer layer 20 is more thermally conductive than the first polymer layer 18 and has a higher resistivity than the semiconductor handle 36 (shown in FIG. 4F), which was made of Silicon. Again, FIG. 1A illustrates exemplary thermal and electronic characteristics for the second polymer layer 20. In this embodiment, an IC package 98 is singulated so that a portion of the printed circuit board 28 (shown in FIG. 4H) is provided as the printed circuit board 12 of the IC package 98 (FIG. 4I). As shown, the semiconductor handle 36 (shown in FIG. 4F) is not provided between the portion 24 of the second polymer layer 20 and the BOX layer 22, the FEOL region 16 and the BEOL region 14. Also, the semiconductor handle 88 (shown in FIG. 4F) is not provided between the portion 94 of the second polymer layer 20 and the insulating layer 86, and the BEOL region 82.

Figure 5:
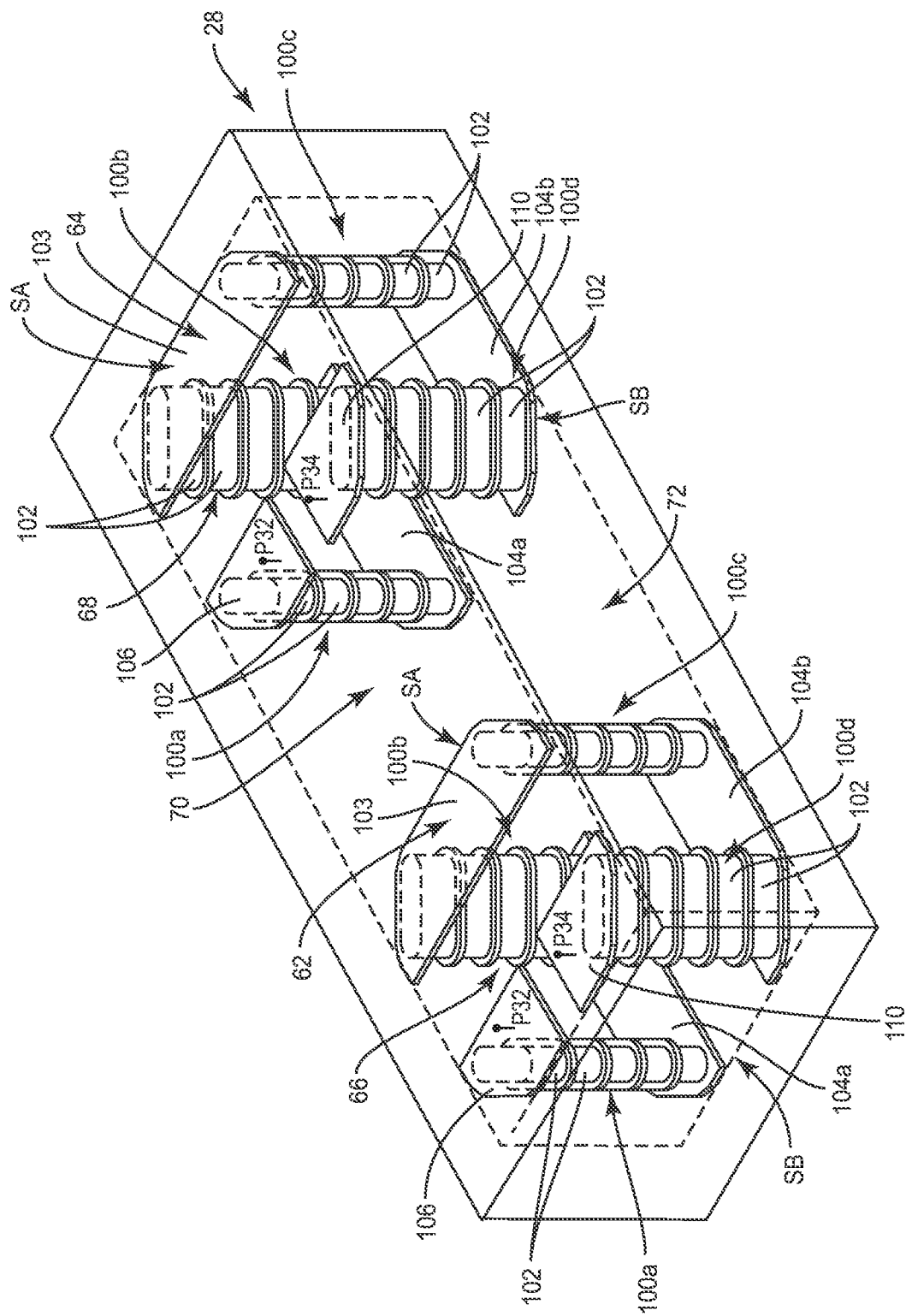
FIG. 5 illustrates one embodiment of a three dimensional (3D) inductor, a 3D inductor, and a magnetic material in a substrate.

FIG. 5 illustrates one embodiment of the 3D inductor 62, the 3D inductor 64 and the magnetic material 72 in the printed circuit board 28 shown in FIG. 4C. The substrate body 30 of the printed circuit board 28 may be any type of suitable non-conductive material(s). Exemplary non-conductive materials include laminate, a semiconductor material, glass, a dielectric, plastic, fiber, and/or the like. The multi-layered substrate thus includes a plurality of laminated substrate layers and metallic structures formed on and between the laminated substrate layers. The laminated substrate layers may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like.

The 3D inductor 62 comprises four solid via columns (referred to generically as element 100, and specifically as solid via columns 100a, 100b, 100c, and 100d). Each of the solid via columns 100 comprises solid via bars 102. Note that all of the solid via bars 102 are not specifically labeled in FIG. 5 for the sake of clarity. The 3D inductor 62 of FIG. 5 also comprises three connector plates 103, 104a, and 104b. The connector plate 103 connects the solid via column 100b to the solid via column 100c on a first side SA of the 3D inductor 62. On a second side SB of the 3D inductor 62 that is antipodal to the first side SA, the connector plate 104a connects the solid via column 100a to the solid via column 100b, and the connector plate 104b connects the solid via column 100c to the solid via column 100d. The 3D inductor 62 of FIG. 5 further comprises two terminal plates 106 and 110. The terminal plates 106 and 110 comprise a terminal connection for the 3D inductor 62 and are connected to the solid via columns 100a, 100d, respectively, at the first side SA. The terminal plates 106 and 110 can be connected to ports $P_{32}$ and $P_{34}$, respectively, for connection to an external component, such as, but not limited to, a tunable capacitor. Note that the 3D inductor 62 shown in FIG. 5 is also a three-dimensional inductor. Furthermore, while the 3D inductor 62 in FIG. 5 is cubic, other embodiments of the 3D inductor 62 may be any shape. For example, an alternative embodiment of the 3D inductor 62 may be rectangular prism, polyhedron, or spherical.

The terminal plate 106 is attached to port $P_{32}$, and the terminal plate 110 is attached to port $P_{34}$, and thus the terminal plates 106, 110 also provide partial connection plates to the ports $P_{32}$, $P_{34}$. Current from the port $P_{32}$ flows to and across the terminal plate 106 down the solid via column 100a to the connector plate 104b. The current flow continues across the connector plate 104b up through the solid via column 100b to the connector plate 104a. The current flow then continues across the connector plate 104a down through the solid via column 100c to the connector plate 104a. The current flow continues up through the solid via column 100d to the terminal plate 110 and up through the port $P_{34}$. Since the current direction of one solid via column 100 is parallel to an adjacent solid via column 100 (for example, the adjacent solid via columns 100a and 100b), the magnetic fields generated from each individual solid via column 100 are predominately destructive collectively at the exterior of the 3D inductor 62, confining the magnetic field to the interior of the 3D inductor 62 of FIG. 5. Thus, the 3D inductor 62 of FIG. 5 contains a small, or substantially zero, coupling factor to adjacent structures. As such, the solid via columns 100a-100d, the connector plates 104a, 104b, and the terminal plates 106, 110 are arranged such that the magnetic field generated by the 3D inductor 62 is substantially confined to the interior of the 3D inductor 62.

The 3D inductor 64 comprises four solid via columns (referred to generically as element 100, and specifically as solid via columns 100a, 100b, 100c, and 100d). Each of the solid via columns 100 comprises solid via bars 102. Note that all of the solid via bars 102 are not specifically labeled in FIG. 5 for the sake of clarity. The 3D inductor 64 of FIG. 5 also comprises three connector plates 103, 104a, and 104b. The connector plate 103 connects the solid via column 100b to the solid via column 100c on a first side SA of the 3D inductor 64. On a second side SB of the 3D inductor 64 that is antipodal to the first side SA, the connector plate 104a connects the solid via column 100a to the solid via column 100b, and the connector plate 104b connects the solid via column 100c to the solid via column 100d. The 3D inductor 64 of FIG. 5 further comprises two terminal plates 106 and 110. The terminal plates 106 and 110 comprise a terminal connection for the 3D inductor 64 and are connected to the solid via columns 100a, 100d, respectively, at the first side SA. The terminal plates 106 and 110 can be connected to ports $P_{32}$ and $P_{34}$, respectively, for connection to an external component, such as, but not limited to, a tunable capacitor. Note that the 3D inductor 64 shown in FIG. 5 is also a three-dimensional inductor. Furthermore, while the 3D inductor 64 in FIG. 5 is cubic, other embodiments of the 3D inductor 64 may be any shape. For example, an alternative embodiment of the 3D inductor 64 may be a rectangular prism, polyhedron, or spherical.

The terminal plate 106 is attached to port $P_{32}$, and the terminal plate 110 is attached to port $P_{34}$, and thus the terminal plates 106, 110 also provide partial connection plates to the ports $P_{32}$, $P_{34}$. Current from the port $P_{32}$ flows to and across the terminal plate 106 down the solid via column 100a to the connector plate 104a. The current flow continues across the connector plate 104a up through the solid via column 100b to the connector plate 104. The current flow then continues across the connector plate 104 down through the solid via column 100c to the connector plate 104b. The current flow continues up through the solid via column 100d to the terminal plate 110 and up through the port $P_{34}$. Since the current direction of one solid via column 100 is parallel to an adjacent solid via column 100 (for example, the adjacent solid via columns 100a and 100b), the magnetic fields generated from each individual solid via column 100 are predominately destructive collectively at the exterior of the 3D inductor 64, confining the magnetic field to the interior of the 3D inductor 64 of FIG. 5. Thus, the 3D inductor 64 of FIG. 5 contains a small, or substantially zero, coupling factor to adjacent structures. As such, the solid via columns 100a-100d, the connector plates 103, 104a, 104b, and the terminal plates 106, 110 are arranged such that the magnetic field generated by the 3D inductor 64 is substantially confined to the interior of the 3D inductor 64.

The interior 66 of the 3D inductor 62, the interior 68 of the 3D inductor 64, and the interior 68 of the 3D inductor 64 are filled with a magnetic material 72. In this manner, the 3D inductor 62 and the 3D inductor 64 may be weakly magnetically coupled where the ferromagnetic characteristics of the magnetic material 72 determine the coupling factor between the 3D inductor 62 and the 3D inductor 64. Again, the magnetic material 72 may be a ferromagnetic material, a ferromagnetic material, and/or the like.

Figure 6A:
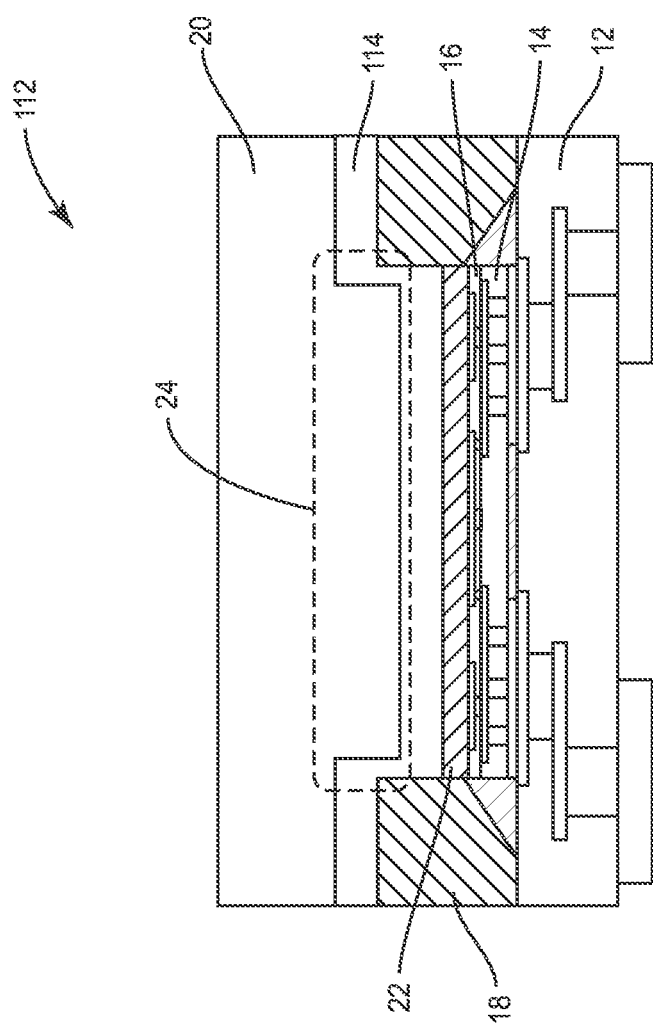
FIG. 6A illustrates another embodiment of an IC package.
Figure 6B:
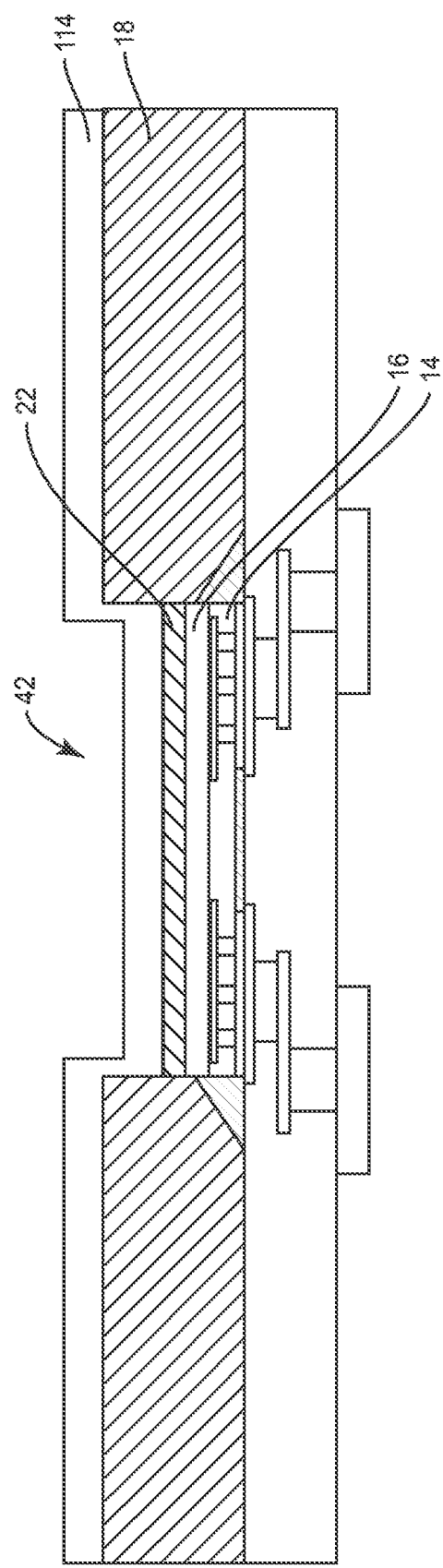
FIG. 6B illustrates the additional procedure used to create the IC package shown in FIG. 6A.

FIG. 6A illustrates another embodiment of an IC package 112. The IC package 112 is the same as the IC package 10 shown in FIG. 1, except that in this embodiment, a Silicon Nitride (SiN) layer 114 is provided between the portion 24 of the second polymer layer 20 and the BOX layer 22. FIG. 6B illustrates the additional procedure used to create the IC package 112. After removing the semiconductor handle 36 (shown in FIG. 2E) to provide the void 42 (shown in FIG. 2F) in the first polymer layer 18 and before providing the second polymer layer 20 (shown in FIG. 2G) within the void 42, forming the SiN layer 114 at least at a bottom surface of the void 42 (as shown in FIG. 6B). Subsequently, the steps in FIGS. 2G-2H are performed to provide the IC package 112 shown in FIG. 6A.

The SiN layer 114 improves the hermeticity of the described structure because it is impervious to the diffusion of water molecules. The addition of the SiN layer 114 as a moisture barrier significantly improves the reliability of the resulting structure with respect to moisture egress. The SiN layer 114 may be deposited using a number of techniques known to those familiar with semiconductor processing, such as the Chemical Vapor Deposition techniques available in the industry.

The SiN layer 114 may have a thickness in the range of 200 A to 5 um. Preferably, the thickness of the SiN layer 114 should be as thin as possible so as to not negatively impact the thermal characteristics of the IC package 112. However, it needs to be thick enough so as to provide the desired amount of hermeticity for a given application. It is envisioned that Silicon Nitride layers in the range of 1000-2000 A thick should satisfy both of these requirements. The SiN deposition should uniformly coat all of the cavities of the RF strip and ensure that no pin holes exist at the BOX/SiN interface.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit (IC) package comprising:
    a printed circuit board;
    a first Back-End-of-Line (BEOL) region mounted on the printed circuit board;
    a first Front-End-of-Line (FEOL) region;
    a first polymer layer provided over the printed circuit board;
    a second polymer layer, which has a thermal conductivity greater than 3 W/mK and a resistivity greater than 5000 Ohm-cm; and
    wherein the first BEOL region, the first FEOL region, and at least a portion of the second polymer layer are stacked and surrounded by the first polymer layer.

2. The IC package of claim 1 further comprising a buried oxide (BOX) layer stacked between the first FEOL region and the at least the portion of the second polymer layer.

3. The IC package of claim 2 further comprising a Silicon Nitride (SiN) layer at least between the BOX layer and the second polymer layer.

4. The IC package of claim 1, wherein the second polymer layer and the first polymer layer are formed from different materials.

5. The IC package of claim 4, wherein the second polymer layer is more thermally conductive than the first polymer layer.

6. The IC package of claim 1, wherein the second polymer layer and the first polymer layer are formed from a same material.

7. The IC package of claim 1 further comprising an underfill support layer underneath and around the first BEOL region on the printed circuit board.

8. The IC package of claim 1, wherein the second polymer layer comprises a first portion and a second portion, wherein the first portion is stacked with the first FEOL region and the first BEOL region, and the second portion is over the first polymer layer.

9. The IC package of claim 1 further comprising a semiconductor die, wherein:
    the semiconductor die comprises a second BEOL region mounted on the printed circuit board, a second FEOL region over the second BEOL region, and a semiconductor handle over the second FEOL region;
    the semiconductor die is encapsulated by the first polymer layer and is not in contact with the second polymer layer; and
    the second polymer layer has a higher resistivity than the semiconductor handle.

10. The IC package of claim 9, wherein the semiconductor die is a Gallium Arsenide die.

11. The IC package of claim 9, wherein the semiconductor die is a silicon die.

12. The IC package of claim 9, wherein the second polymer layer has a resistivity that is several orders of magnitude higher than a resistivity of the semiconductor handle.

13. The IC package of claim 1, wherein the printed circuit board comprises:
    a substrate body formed from an insulating material; and
    a metallic structure integrated into the substrate body.

14. The IC package of claim 13, wherein the metallic structure forms a three dimensional (3D) inductor within the substrate body.

15. The IC package of claim 14, wherein the 3D inductor defines an interior that is filled with a magnetic material.

16. The IC package of claim 15, wherein the magnetic material is ferromagnetic material.

17. The IC package of claim 1 further comprising a Silicon Nitride (SiN) layer at least between the first FEOL region and the second polymer layer.

* * * * *